(12) United States Patent
Schulte

(10) Patent No.: US 12,245,381 B2
(45) Date of Patent: *Mar. 4, 2025

(54) THERMOCOMPRESSION BONDING WITH PASSIVATED NICKEL-BASED CONTACTING METAL

(71) Applicant: SET North America, LLC, Chester, NH (US)

(72) Inventor: Eric Frank Schulte, Santa Barbara, CA (US)

(73) Assignee: SET NORTH AMERICA, LLC, Chester, NH (US)

( * ) Notice: Subject to any disclaimer, the term of this patent is extended or adjusted under 35 U.S.C. 154(b) by 286 days.

This patent is subject to a terminal disclaimer.

(21) Appl. No.: 17/085,890

(22) Filed: Oct. 30, 2020

(65) Prior Publication Data

US 2021/0219475 A1 Jul. 15, 2021

Related U.S. Application Data

(63) Continuation of application No. 13/781,927, filed on Mar. 1, 2013, now Pat. No. 11,134,598, which is a
(Continued)

(51) Int. Cl.
*H05K 13/04* (2006.01)
*H01L 23/00* (2006.01)
(Continued)

(52) U.S. Cl.
CPC ............ *H05K 13/046* (2013.01); *H01L 24/11* (2013.01); *H01L 24/81* (2013.01); *H01L 25/50* (2013.01);
(Continued)

(58) Field of Classification Search
None
See application file for complete search history.

(56) References Cited

U.S. PATENT DOCUMENTS 4,865,245 A * 9/1989 Schulte ................... H01L 24/81
257/E21.705
6,471,115 B1 * 10/2002 Ijuin ....................... H01L 21/563
228/205
(Continued)

OTHER PUBLICATIONS

Chen et al., "Wafer-level bonding/stacking technology for 3D integration", Microelectronics Reliability, vol. 50, p. 481-488, 2009 (Year: 2009).*

*Primary Examiner* — Devang R Patel
(74) *Attorney, Agent, or Firm* — AKC PATENTS, LLC; Aliki K. Collins

(57) ABSTRACT

Methods and systems for low-force, low-temperature thermocompression bonding. The present application teaches new methods and structures for three-dimensional integrated circuits, in which cold thermocompression bonding is used to provide reliable bonding. To achieve this, reduction and passivation steps are preferably both used to reduce native oxide on the contact metals and to prevent reformation of native oxide, preferably using atmospheric plasma treatments. Preferably the physical compression height of the elements is set to be only enough to reliably achieve at least some compression of each bonding element pair, compensating for any lack of flatness. Preferably the thermocompression bonding is performed well below the melting point. This not only avoids the deformation of lower levels which is induced by reflow techniques, but also provides a steep relation of force versus z-axis travel, so that a drastically-increasing resistance to compression helps to regulate the degree of thermocompression.

3 Claims, 13 Drawing Sheets

Related U.S. Application Data continuation-in-part of application No. 12/837,751, filed on Jul. 16, 2010, now Pat. No. 8,567,658.

(60) Provisional application No. 61/606,442, filed on Mar. 4, 2012, provisional application No. 61/227,063, filed on Jul. 20, 2009.

(51) Int. Cl.
*H01L 25/00* (2006.01)
*B32B 38/00* (2006.01)

(52) U.S. Cl.
CPC ....... *B32B 38/0008* (2013.01); *B32B 2310/14* (2013.01); *B32B 2457/00* (2013.01); *H01L 24/13* (2013.01); *H01L 24/16* (2013.01); *H01L 2224/0381* (2013.01); *H01L 2224/0401* (2013.01); *H01L 2224/05552* (2013.01); *H01L 2224/05557* (2013.01); *H01L 2224/05568* (2013.01); *H01L 2224/05655* (2013.01); *H01L 2224/11334* (2013.01); *H01L 2224/1181* (2013.01); *H01L 2224/11831* (2013.01); *H01L 2224/13099* (2013.01); *H01L 2224/131* (2013.01); *H01L 2224/13105* (2013.01); *H01L 2224/13109* (2013.01); *H01L 2224/13111* (2013.01); *H01L 2224/13113* (2013.01); *H01L 2224/13116* (2013.01); *H01L 2224/1312* (2013.01); *H01L 2224/13124* (2013.01); *H01L 2224/13139* (2013.01); *H01L 2224/13144* (2013.01); *H01L 2224/16145* (2013.01); *H01L 2224/81011* (2013.01); *H01L 2224/81013* (2013.01); *H01L 2224/81054* (2013.01); *H01L 2224/81099* (2013.01); *H01L 2224/81191* (2013.01); *H01L 2224/81193* (2013.01); *H01L 2224/812* (2013.01); *H01L 2224/81201* (2013.01); *H01L 2224/81365* (2013.01); *H01L 2224/81895* (2013.01); *H01L 2224/81897* (2013.01); *H01L 2225/06513* (2013.01); *H01L 2225/06565* (2013.01); *H01L 2924/00* (2013.01); *H01L 2924/0001* (2013.01); *H01L 2924/00014* (2013.01); *H01L 2924/01006* (2013.01); *H01L 2924/01013* (2013.01); *H01L 2924/01014* (2013.01); *H01L 2924/01022* (2013.01); *H01L 2924/01029* (2013.01); *H01L 2924/0103* (2013.01); *H01L 2924/01032* (2013.01); *H01L 2924/01033* (2013.01); *H01L 2924/01042* (2013.01); *H01L 2924/01047* (2013.01); *H01L 2924/01049* (2013.01); *H01L 2924/0105* (2013.01); *H01L 2924/01051* (2013.01); *H01L 2924/01073* (2013.01); *H01L 2924/01074* (2013.01); *H01L 2924/01075* (2013.01); *H01L 2924/01079* (2013.01); *H01L 2924/01082* (2013.01); *H01L 2924/01327* (2013.01); *H01L 2924/014* (2013.01); *H01L 2924/14* (2013.01); *H01L 2924/1431* (2013.01); *H01L 2924/1461* (2013.01)

(56) References Cited

U.S. PATENT DOCUMENTS

| | | | | |
|---|---|---|---|---|
| 6,551,860 | B2* | 4/2003 | Uner | B23K 1/206 |
| | | | | 134/1 |
| 6,712,260 | B1* | 3/2004 | Kuo | B23K 1/0016 |
| | | | | 228/205 |
| 6,870,270 | B2* | 3/2005 | Kobrinsky | H01L 24/11 |
| | | | | 257/777 |
| 8,163,094 | B1* | 4/2012 | Greer | H01L 24/11 |
| | | | | 134/1.1 |
| 8,967,452 | B2* | 3/2015 | Cheung | H01L 24/75 |
| | | | | 228/230 |
| 11,134,598 | B2* | 9/2021 | Schulte | H01L 25/50 |
| 2003/0116845 | A1* | 6/2003 | Bojkov | H01L 24/11 |
| | | | | 257/E23.021 |
| 2006/0234472 | A1* | 10/2006 | Gabriel | H01L 21/187 |
| | | | | 438/455 |
| 2007/0232023 | A1* | 10/2007 | Tong | H01L 25/50 |
| | | | | 438/455 |
| 2010/0120245 | A1* | 5/2010 | Tjandra | C23C 16/56 |
| | | | | 257/E21.3 |

\* cited by examiner

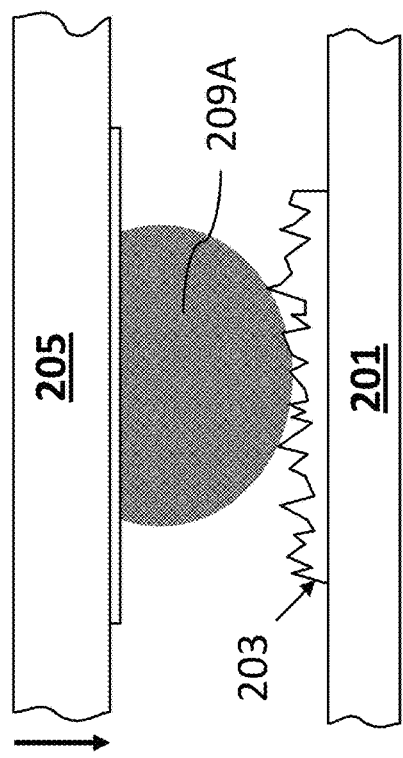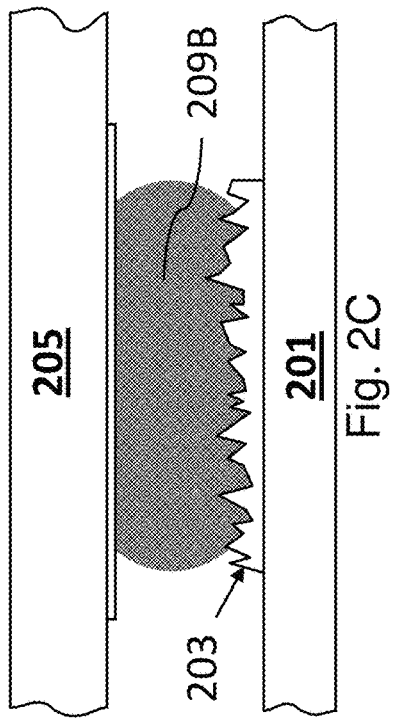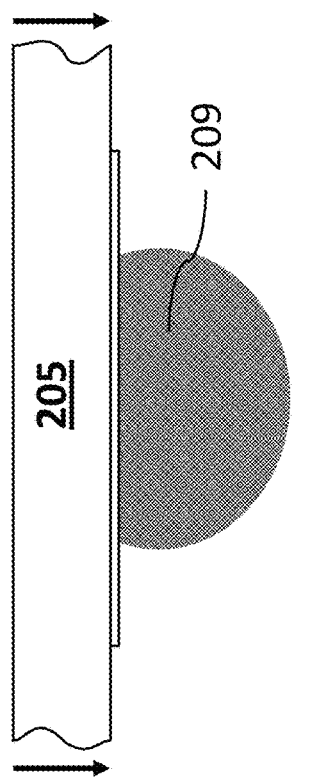
Fig. 2A
Fig. 2B
Fig. 2C

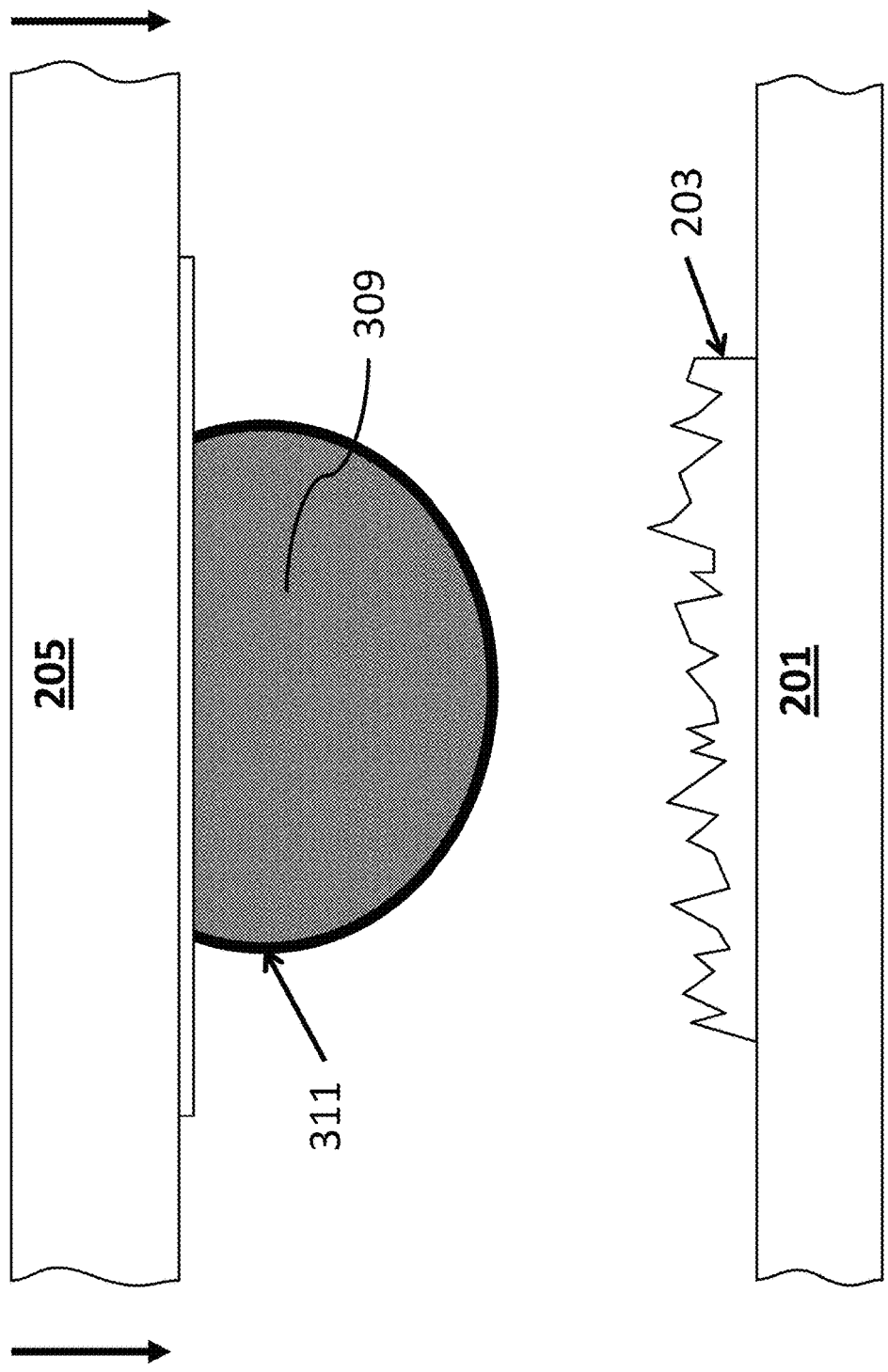
Fig. 3A - Compression

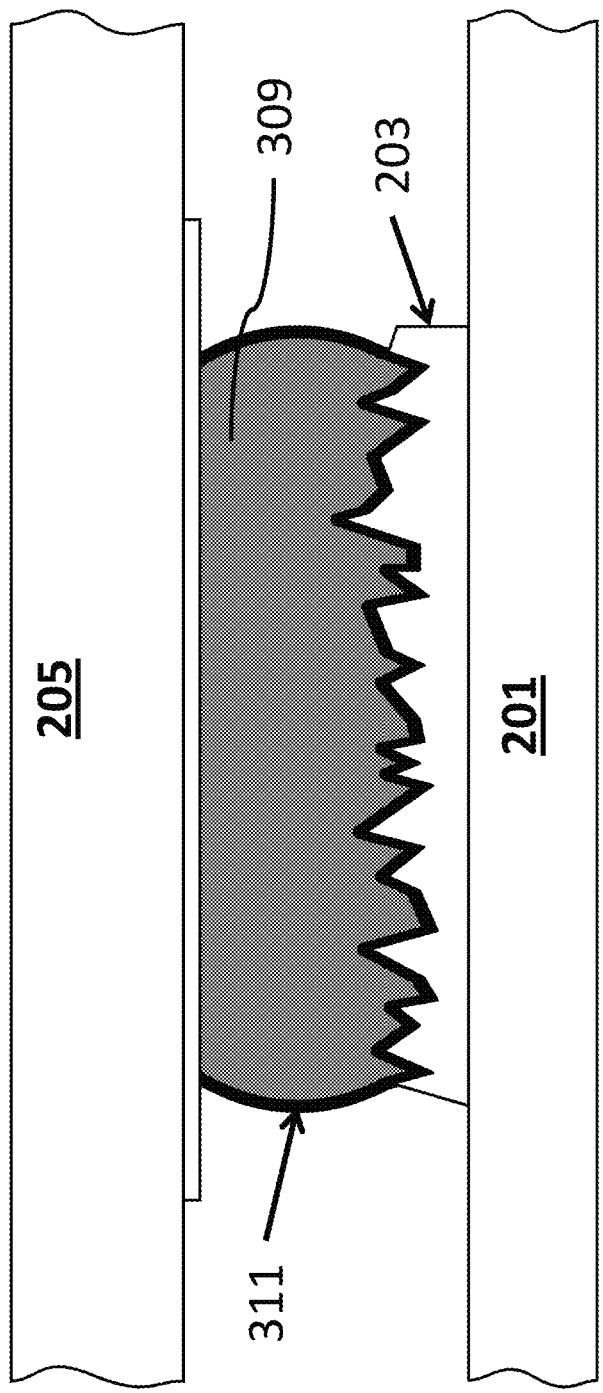
Fig. 3B - Partial Contact

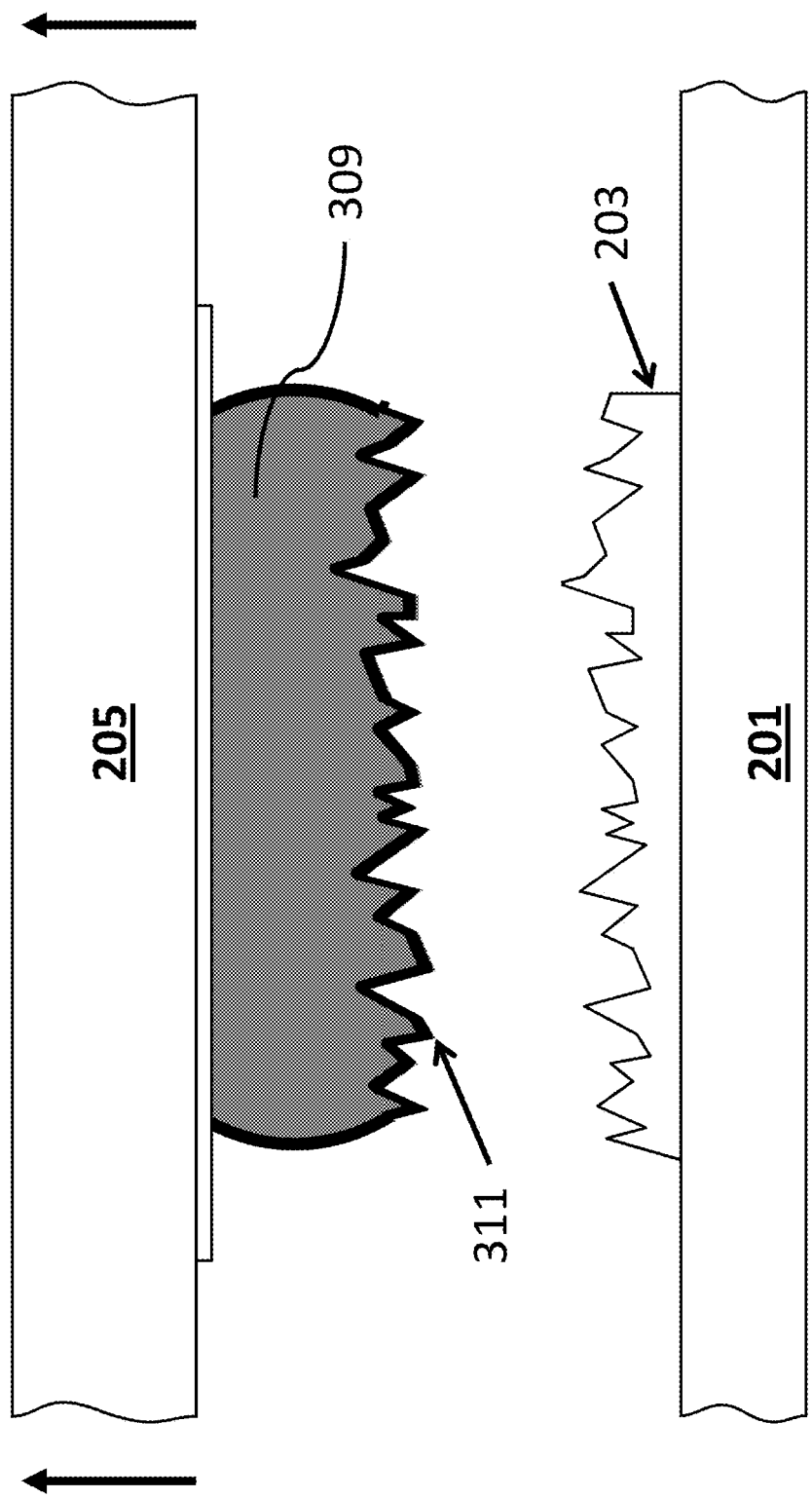
Fig. 3C - Failure

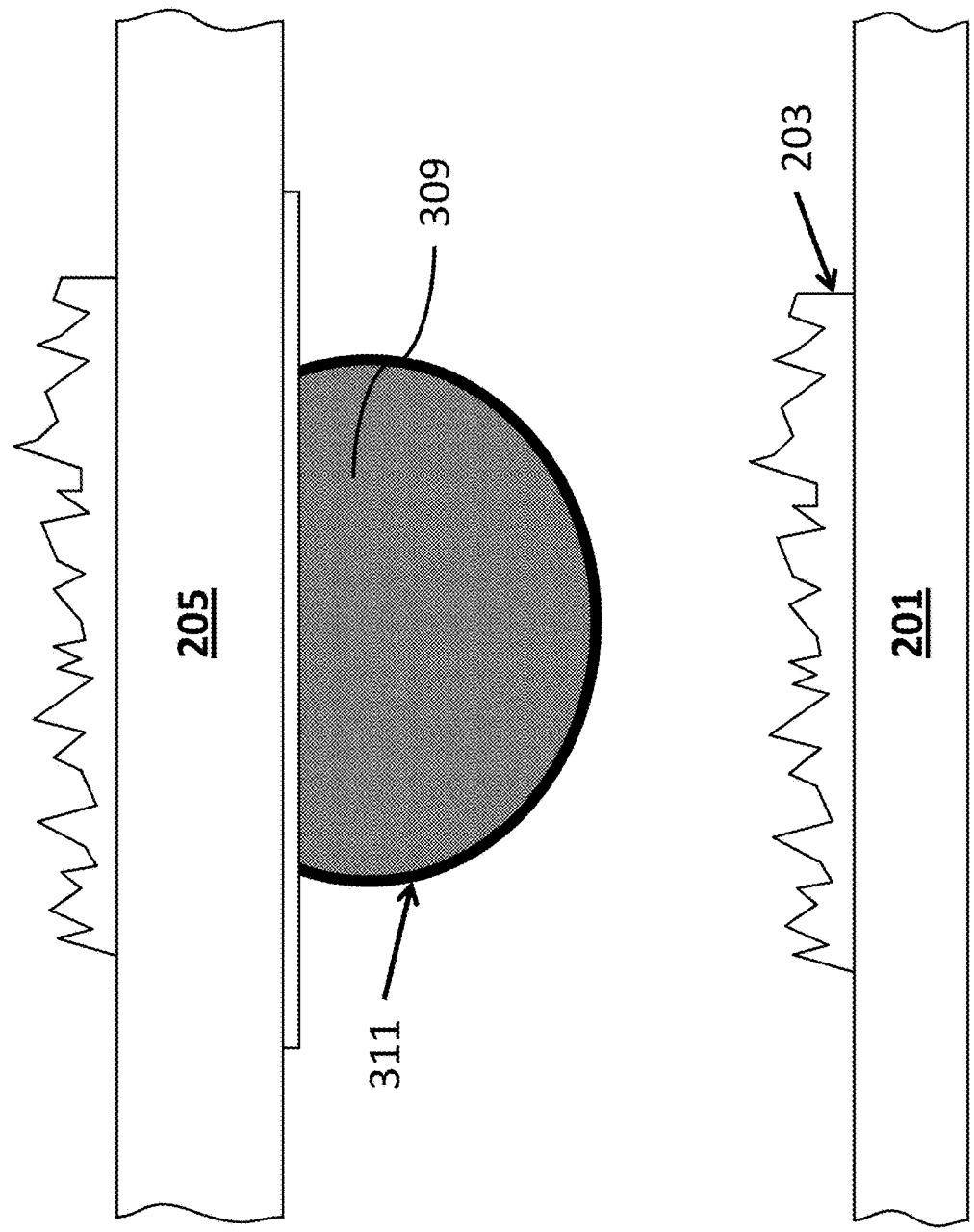
Fig. 4A - Initial

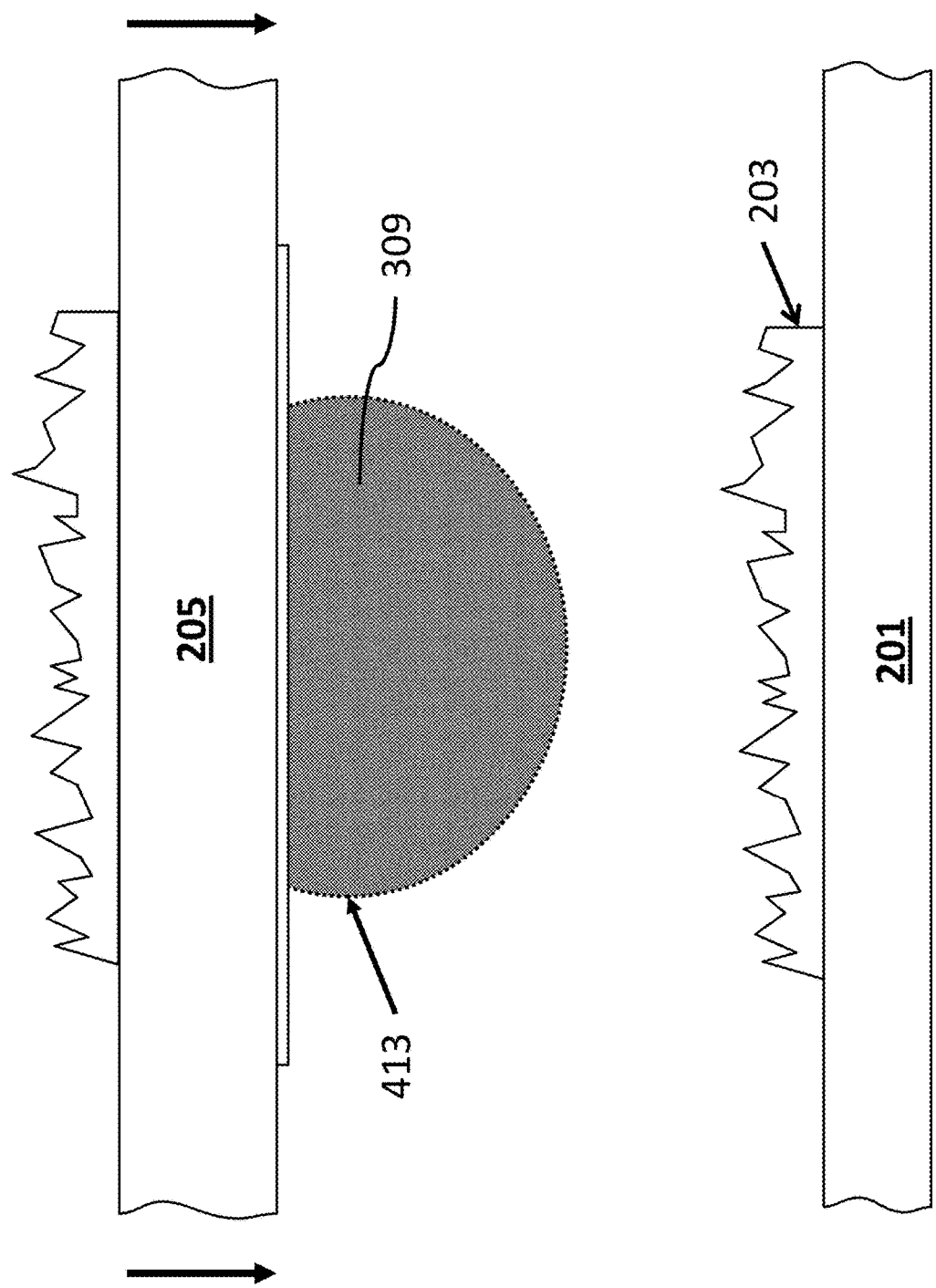
Fig. 4B - Reduced and Passivated

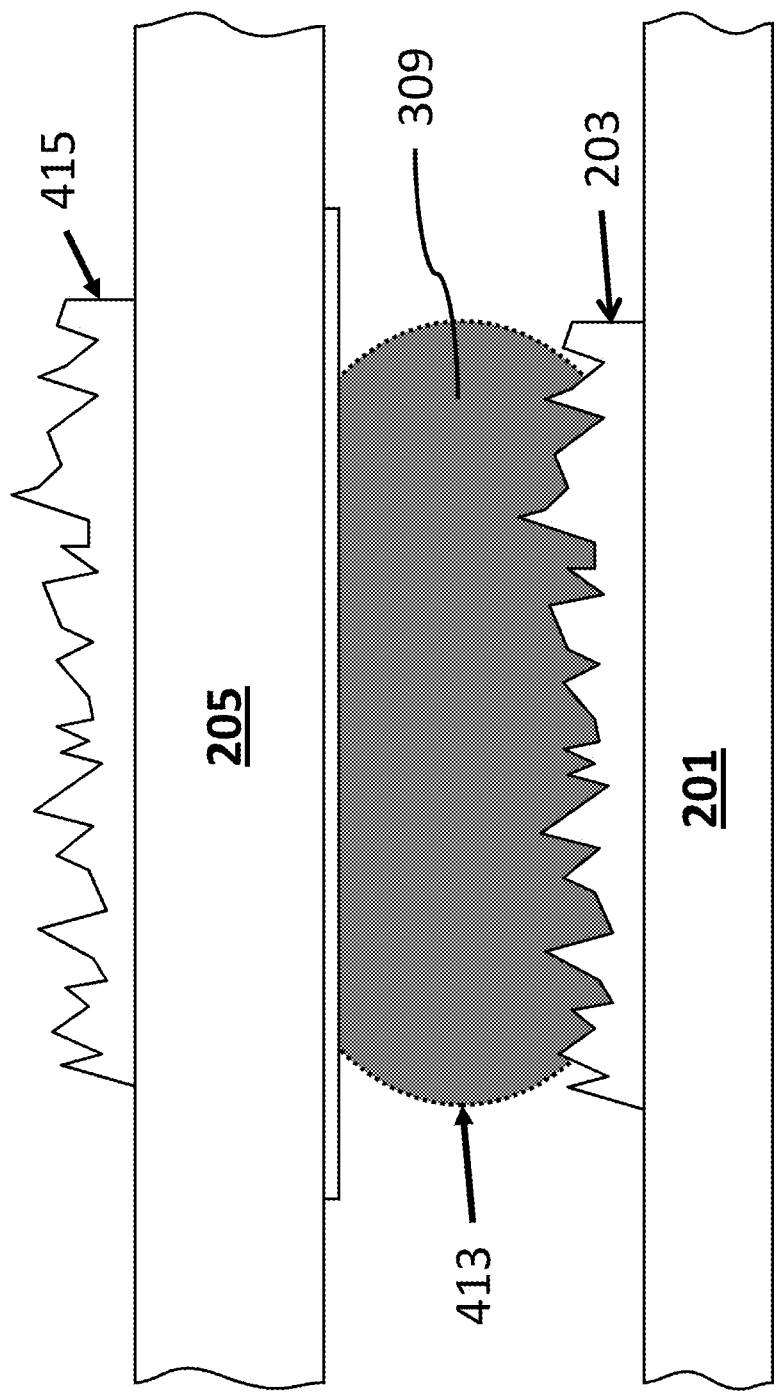
Fig. 4C - Full Contact

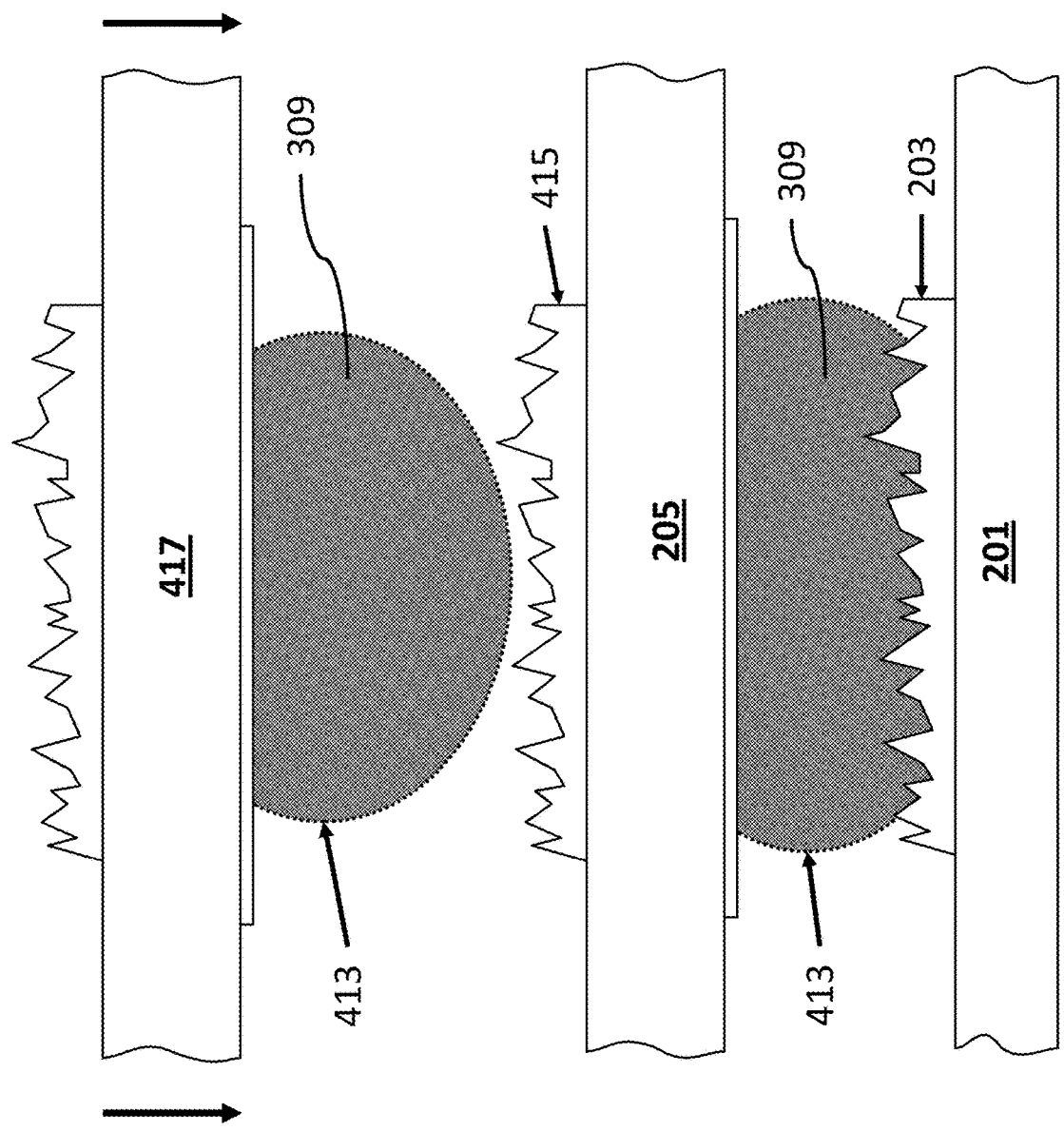
Fig. 4D – Third Chip

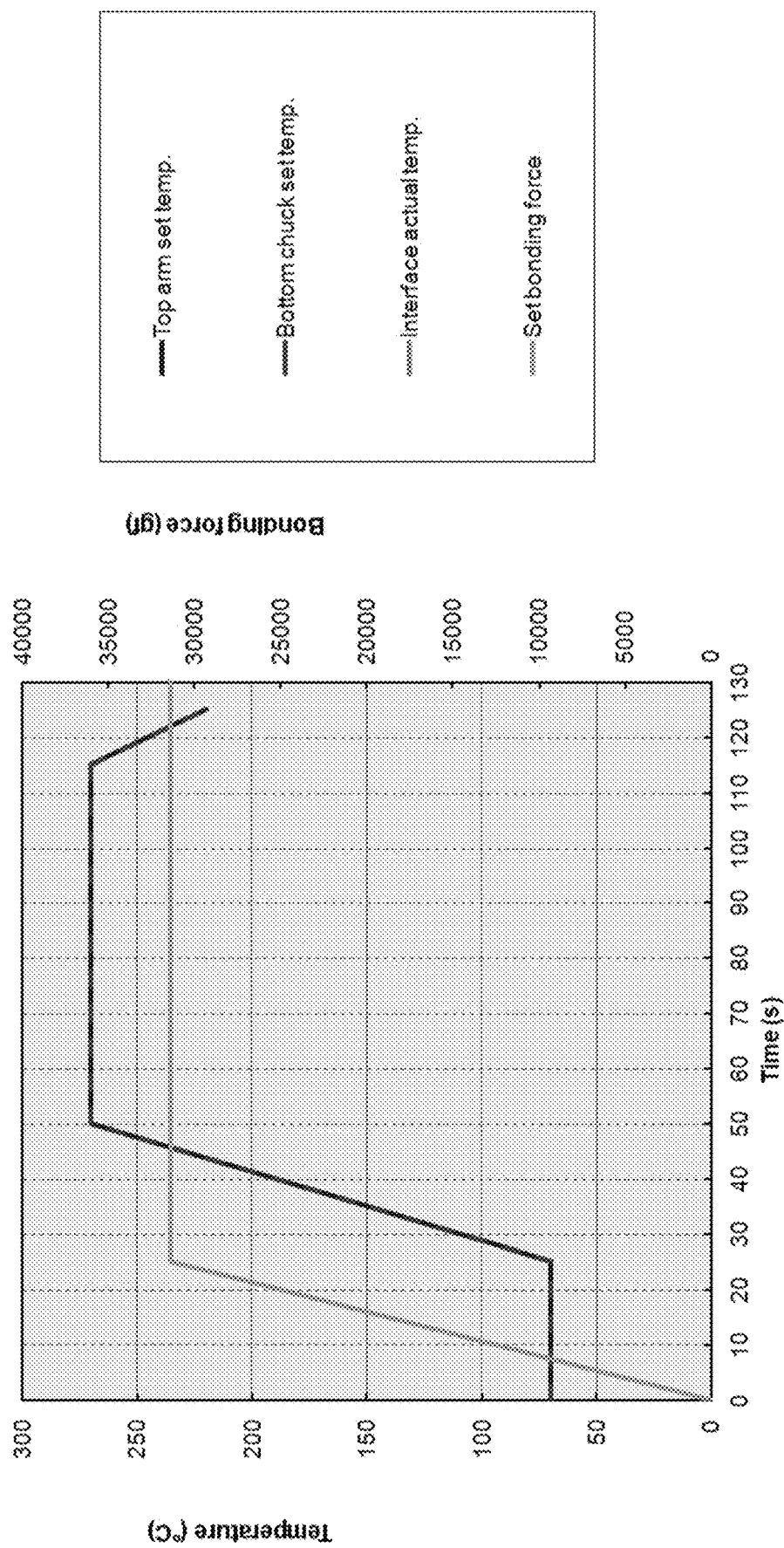
Fig. 7: Sn against Cu

THERMOCOMPRESSION BONDING WITH PASSIVATED NICKEL-BASED CONTACTING METAL

CROSS-REFERENCE

Priority is claimed from 61/604,162 filed Mar. 4, 2012, which is hereby incorporated by reference.

The present application is a continuation-in-part of Ser. No. 12/837,751 filed Jul. 16, 2010, which is hereby incorporated by reference.

BACKGROUND

The present application relates to 3D interconnect bonding of multiple chips, and more particularly to reliable 3D interconnect bonding of multiple chips without solder reflow.

Note that the points discussed below may reflect the hindsight gained from the disclosed inventions, and are not necessarily admitted to be prior art.

Metallic contact flip-chip interconnect bonding techniques are currently under development in the semiconductor integration and packaging industry to enable vertical stacking of multiple dice with high density interconnects between each subsequent die in the vertical stack. This is referred to in the semiconductor industry as "3D Packaging" or "3DIC".

Conventional "flip-chip" reflow solder bonding techniques are currently being used to align and then fuse solder connections between facing chips by melting solder bumps to form an electrical and mechanical connection between the chips. This has been accomplished in commercial production for many years in the mounting of single chips to circuit boards and in the bonding of two facing chips to each other.

The present application teaches that a problem arises, however, when a third or subsequent chip is to be added vertically or horizontally to an already reflowed chip assembly. When the additional solder connections are reflowed (melted), the original solder connections are also melted, leaving the whole stack susceptible to loss of original alignment, parallelism, and contact.

This problem is compounded further if multiple stacked-chip groups are to be assembled, one at a time, onto a single substrate. In this case, each previous stack is also subjected to the same de-stabilizing effects of re-melting the previously-made solder connections.

The long-term heating of multiple assemblies during subsequent chip additions can also lead to degradation of heat-sensitive circuit components and materials.

If the stacked chips are of differing materials such that their coefficient of thermal expansion (CTE) varies from chip to chip, the differential expansion and contraction between die during the thermal cycling associated with repeated solder reflow cycles can further exacerbate alignment, parallelism, interconnect, and reliability issues.

If one or more of the earlier-assembled components has a natural bow or non-flatness, subsequent melting can allow the non-flat component to seek its original shape, thus causing previously good inter-component bonds to separate. Cycling the temperature of components during bonding also consumes process time, reduces throughput, and consumes precious energy resources.

Also, when chips of differing CTE are cycled above the melting point of the solder and then returned to below the melting point, there is a built-in stress induced between the two components. This stress is proportional to the temperature swing between melting point temperature and any reduced temperature of the chip assembly. This built-in stress can lead to reliability issues due to fatigue of stressed components during subsequent thermal cycling of remaining manufacturing steps, or in actual use of the components. Reducing the bonding temperature (as taught by the present application) has a directly beneficial effect on reducing this built-in stress fatigue failure mechanism.

SUMMARY

The present application relates to 3D bonding of multiple chips, including e.g. complex logic, power switching devices, optoelectronic emissions devices, imaging chips, MEMS, and other types of chips.

The present application teaches that stacks of three or more chips can be made without using reflow techniques. A cold temperature, well below the melting point of the relevant conductive vertical connection material, permits the (N+1)th chip to be added without disrupting the bonding of the Nth chip. In preferred implementations of this, oxide reduction and/or passivation steps are used to avoid native oxide and improve the adhesion and specific conductance of each interconnect. Since the height of the bump is not controlled by fluidic forces, as in reflow soldering, the height of the interconnect can be more directly controlled by the applied bonding force. Thus by using reduction and/or passivation in combination with controlled bond height and cold assembly, a far more scalable process for 3D assembly is provided.

The disclosed innovations, in various embodiments, provide one or more of at least the following advantages. However, not all of these advantages result from every one of the innovations disclosed, and this list of advantages does not limit the various claimed inventions.

Low-temperature assembly of chip stacks without solder reflow.

High reliability and alignment accuracy.

Broad assembly design flexibility.

Reduced energy expenditure.

Reduced thermal cycling during the 3D bonding processes, which avoids residual built-in stress forces in the finished product, and can improve reliability of the final product.

Better control of bump compression and lateral squeeze-out.

Higher process throughput.

Equivalent bonding stability to conventional methods with much less compression force.

BRIEF DESCRIPTION OF THE DRAWINGS

The disclosed inventions will be described with reference to the accompanying drawings, which show important sample embodiments and which are incorporated in the specification hereof by reference, wherein:

FIGS. 2A-2C show an example of a prior art bonding method.

FIGS. 3A-3C show an example of an unfavorable bonding method.

FIGS. 4A-4D show one sample embodiment of the innovative methods of the present inventions.

FIG. 7 shows some experimental data.

DETAILED DESCRIPTION OF SAMPLE EMBODIMENTS

The numerous innovative teachings of the present application will be described with particular reference to presently preferred embodiments (by way of example, and not of limitation). The present application describes several inventions, and none of the statements below should be taken as limiting the claims generally.

The present inventions teach a unique combination of materials and bonding techniques, including some or all of: (1) deformable metallic bumps of specialized metallurgy, (2) specialized surface preparation (preferably e.g. reduction and passivation) of bumps and/or contacts prior to bonding, and (3) specialized chip-to-substrate and/or chip-to-chip bonding parameters. This combination allows multiple chip stacks to be assembled at reduced temperatures (below the melting point of the solder) without the need for subsequent reflow, while maintaining high reliability, high alignment accuracy, broad assembly design flexibility, reduced energy expenditure, and higher process throughput.

The present application teaches that reliable bonds can be formed with significantly less force than conventional methods. Without the surface preparation methods of the present application, bumps must be compressed to at most half their original height to achieve a reasonable bond. A bump with an initial height of 10 microns will have a final height no greater than 5 microns. With the present inventive methods, reliable bonds can be achieved when bumps and contacts only just touch. Deformation can ideally be e.g. 25%, so that a bump with an initial height of 10 microns can have a final height of e.g. 7.5 microns.

Figure 1:
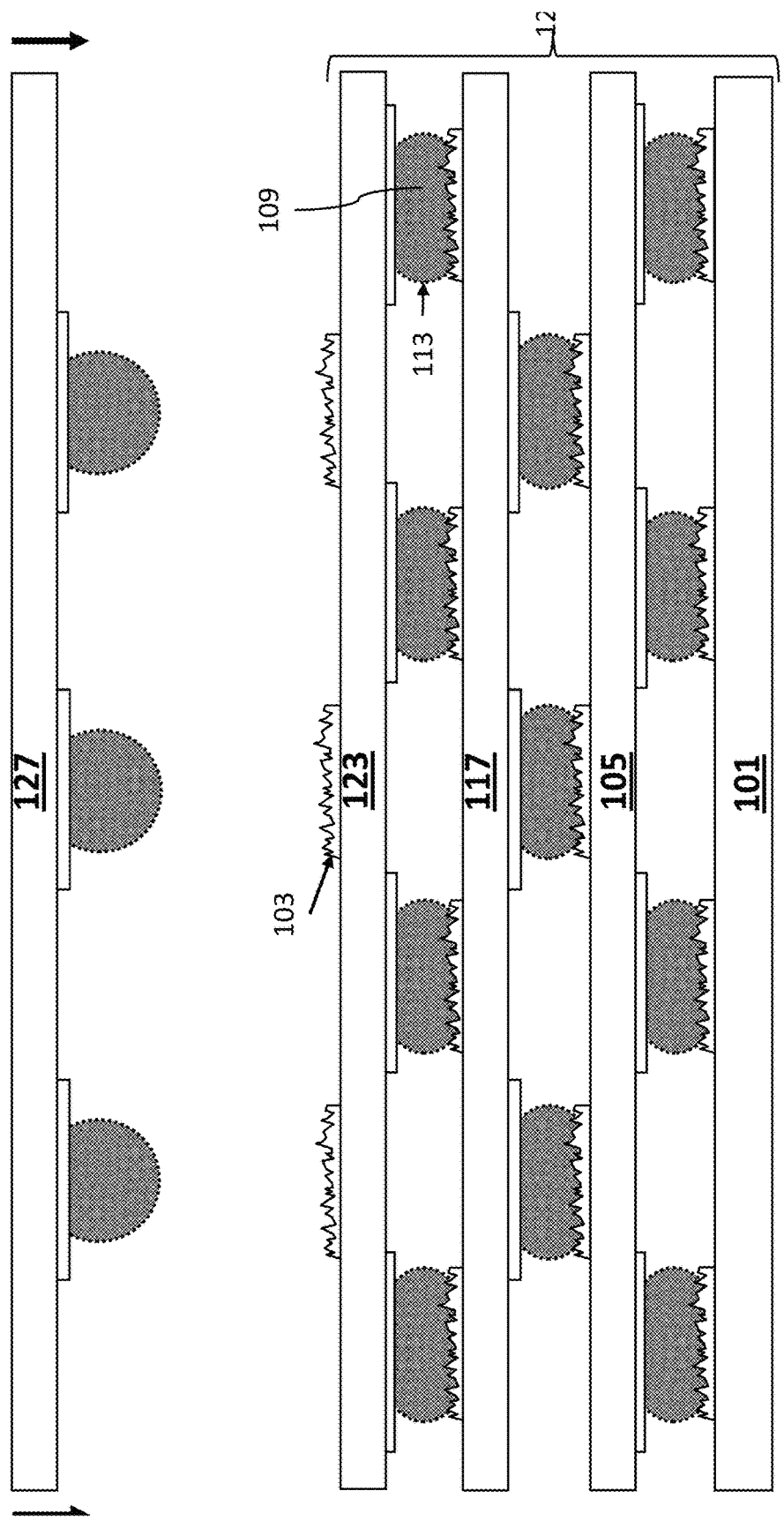
FIG. 1 shows one sample embodiment of the present inventions.

FIG. 1 illustrates an example of a 3D packaging multilayer assembly of chips which is possible with the present innovative methods. Passivation layer 113 is formed on bumps 109 and (not shown) on contact pads 103 after removal of surface oxidation. Chips 101, 105, 117, and 123 are sequentially aligned and bonded at a temperature below the melting points of bumps 109 and contact pads 103. The metallic compositions of bumps 109 and contact pads 103 are selected so that bumps 109 can deform at the bonding temperatures. This permits each subsequent chip 127 to be bonded atop stack 125 without the need to subject stack 125 to potentially damaging high temperatures and repeated thermal cycling associated with solder reflow.

FIG. 2A shows bump 209 (which can be e.g. a bump of solder) ready for cold compression (below the melting point of the bump material) into opposing contact pad 203. Note that this is a zoomed-in view of a single bump, so that chips 201 and 205 can be e.g. sections of chips 101 and 105 from FIG. 1. The surface of the contact pad 203 has been exaggerated in these drawings to illustrate the micro-roughness typical of thin-film contact metal deposition encountered in semiconductor processing.

FIG. 2B shows a stage in attempting to compress a hard solder bump 209A into the contact pad morphology—there is little actual surface contact between hard bump 209A and contact pad 203 except for at the peaks of the contact metal surface. If insufficient force is applied or the temperature is too low to permit appropriate deformation of the bump 209A into the contact pad 203, the process will halt at this stage, resulting in a weak or failed bond.

In contrast, FIG. 2C shows the intimate and continuous connection that can be achieved between bump 209B and contact pad 203 under the proper conditions. If the metallic composition of the bump 209B allows it to be deformed into the micro-morphology of the contact pad 203 at the bonding temperature, which is preferably significantly below its melting point, bonding can properly continue past the first contact stage shown in FIG. 2B. This can permit significantly better mechanical and electrical connection than can be achieved with hard solder bump 209A.

The integrity of this contact is comparable to that achieved by traditional reflow methods, which melt the solder to allow it to flow into the microstructure of the contact. However, by appropriate selection of deformable solder composition, melting of the solder is not necessary to achieve adhesion and conduction comparable to a melted (reflowed) connection.

Comparison of FIGS. 2B and 2C illustrates the importance of deformation and conformality of the bump material. The better the unmelted bump can conform (under pressure) to the topography of the opposing surface, the greater the contact area between the two surfaces. This increased intimate contact area enhances the adhesion/cohesion of the bump to the opposing contact surface. This also permits more efficient and direct inter-diffusion of contact metal species on each side of the contact (if inter-metallic formation is desired).

As discussed below, careful selection of bump metal and opposing contact metal can maximize the integrity of the joint by maximizing intimate interfacial contact area, taking into account how much deformation is required for the specific surface morphology of a particular contact metal surface.

For example, plated nickel as a contact metal pad has relatively high surface morphology. Choosing a softer bump material (i.e. one having lower Young's modulus), for example indium, can be advantageous to achieve greater intimate contact area.

In the case of certain metal combinations (e.g. silver-to-tin or indium-to-silver), the intimate contact also enables more complete inter-diffusion of opposing metals. This generally promotes a stronger bond between the two which has higher-temperature-stability.

However, the deformability of the bumps is not sufficient to provide reliable, low-resistance contact within the bump-to-pad interface. Native oxides can often grow on metal bumps and pads when exposed to room air for even a short time period. These oxidation layers can and do inhibit metallurgical bonding of bump metal to contact metal.

This oxide inhibition can manifest in weak mechanical integrity of the bond, increased electrical resistance across the bump-to-pad interface, and inhibited intermetallic alloying. All of these phenomena can have negative effects on device reliability and performance. Therefore, to take advantage of the deformability of e.g. softer solders, the oxidation must be removed from the mating metal surfaces (usually both bump and contact) prior to compression bonding.

In FIG. 3A, chips 201 and 205 are to be bonded by compressing solder bump 309 into contact pad 203. Note particularly native oxide layer 311 in place on the surface of bump 309 prior to compression bonding.

In FIG. 3B, the inhibiting layer of oxide 311 remains between the bump metal 309 and contact pad 203, causing increased contact resistance and severely reduced adhesion between the two.

FIG. 3C shows ready separation of bump 309 from contact pad 203 at the oxide interfacial layer 311. In a practical electronic device, this typically constitutes a failure of the overall device.

Without proper removal of metallic oxides which naturally form on these metallic bumps and/or contacts, the deformed bump will not be able to adhere to its opposing surface, electrical/mechanical connection integrity will be poor, and interdiffusion will be impeded.

There are numerous methods for removing native oxides prior to bonding. These can include acid etching, fluxing, exposure to reducing vapors such as formic acid, high-temperature treatment with Forming Gas, and vacuum system treatments such as reactive-ion-etch, ion milling, or back-sputtering.

Each of these methods for removing native oxides has its attending advantages and drawbacks. One notable drawback of all of these processes is the re-growth of oxidation on the surface as soon as the removal process stops. This re-oxidation is made worse if the subsequent bonding process requires elevated temperatures.

Parent application U.S. Ser. No. 12/837,751 taught novel methods of removing this oxide layer and preventing further oxidation by applying reducing and passivating agents via a plasma applicator operating under ambient atmospheric conditions. The plasma applicator can be, for example, a moving plasma applicator head which operates under substantially ambient atmospheric pressure and temperature. One advantage of these methods is that no vacuum chamber or other containment chamber is needed, though they are of course not limited by the presence of such a containment chamber. An atmospheric plasma source with specialized chemistry can both reduce native oxides from the surface of metals and create a very thin passivating layer on the de-oxidized metal surface.

This passivation layer can inhibit re-oxidation for long periods and elevated temperatures. This can be used to form a thin passivation layer over a deformable metallic bump or metallic contact. This passivation layer inhibits oxide formation, but is easily disintegrated when compression bonding occurs. The reduction and passivation can be performed simultaneously or sequentially, as desired or appropriate.

The passivation layer is most preferably so thin that it disintegrates with the slightest amount of contact force between bump and pad, and therefore does not affect the quality of the bond. This can provide an ideal surface for both the deformable bump and opposing contact such that a strong metallurgical and electrical bond can be made. The bond is enhanced by the increased contact surface area of the deformable bump and by unimpeded intermetallic alloying.

The surface preparation step allows the deformable bumps to gain intimate metallurgical connection with the opposing contact surface and create a highly adhesive, conductive, and diffusible connection.

FIGS. 4A-4D show one sample embodiment of the present innovative bonding methods. In FIG. 4A, chip 201 is to be bonded to chip 205. Metallic bump 309 has been formed on chip 205. Note that a layer of native oxide 311 has formed on bump 309. While no such oxide layer is explicitly shown on contact pad 203, most contact metals will also develop native oxide layers. The reduction and passivation processes applied to bumps can thus also be applied to contacts as appropriate.

In FIG. 4B, oxide layer 311 has been removed, and a passivation coating 413 has been formed on the surface of bump 309 to prevent formation of any further oxide. This is most preferably by an atmospheric plasma treatment for reduction and passivation as taught in parent application Ser. No. 12/837,751.

In FIG. 4C, bump 309 has been compressed into contact pad 203, bonding chips 201 and 205 without heating the system to the melting point of either bump 309 or contact pad 203. A subsequent chip can then be bonded to chip 205 by repeating the steps of FIGS. 4A-4C with contact pad 415, on the other side of chip 205 from bump 309.

This can be seen in e.g. FIG. 4D, where chip 417 is being bonded to the stack formed by chips 201 and 205. The steps of FIGS. 4A-4D can be repeated as many times as desired to construct multi-chip stacks of arbitrary size.

Most preferably, the passivation layer is not really a film on the surface. Rather, it can, for example, be one or two atomic layers of e.g. nitrogen atoms that are attached to the dangling bonds of the metal's top atomic layer. The binding energy of a nitrogen-metal bond is enough to resist normal exposure to atmospheric oxygen. There is not normally enough thermodynamic incentive for the metal to let go of the nitrogen and extract an oxygen atom from an $O_2$ molecule.

However, during the actual bonding, the surfaces of the bump and contact are being ground together not unlike a glacier over granite. The medium-strength nitrogen-metal bonds are "scrubbed" away, and the more thermodynamically favorable metal-to-metal bonds are readily formed. The "scrubbed" nitrogen will likely sit as atomic interstitials in the metal atomic lattice structure near the metal interface. These nitrogen atoms scattered in the metallic lattice will have insignificant effect on the strength of the new bond.

Figure 5A:
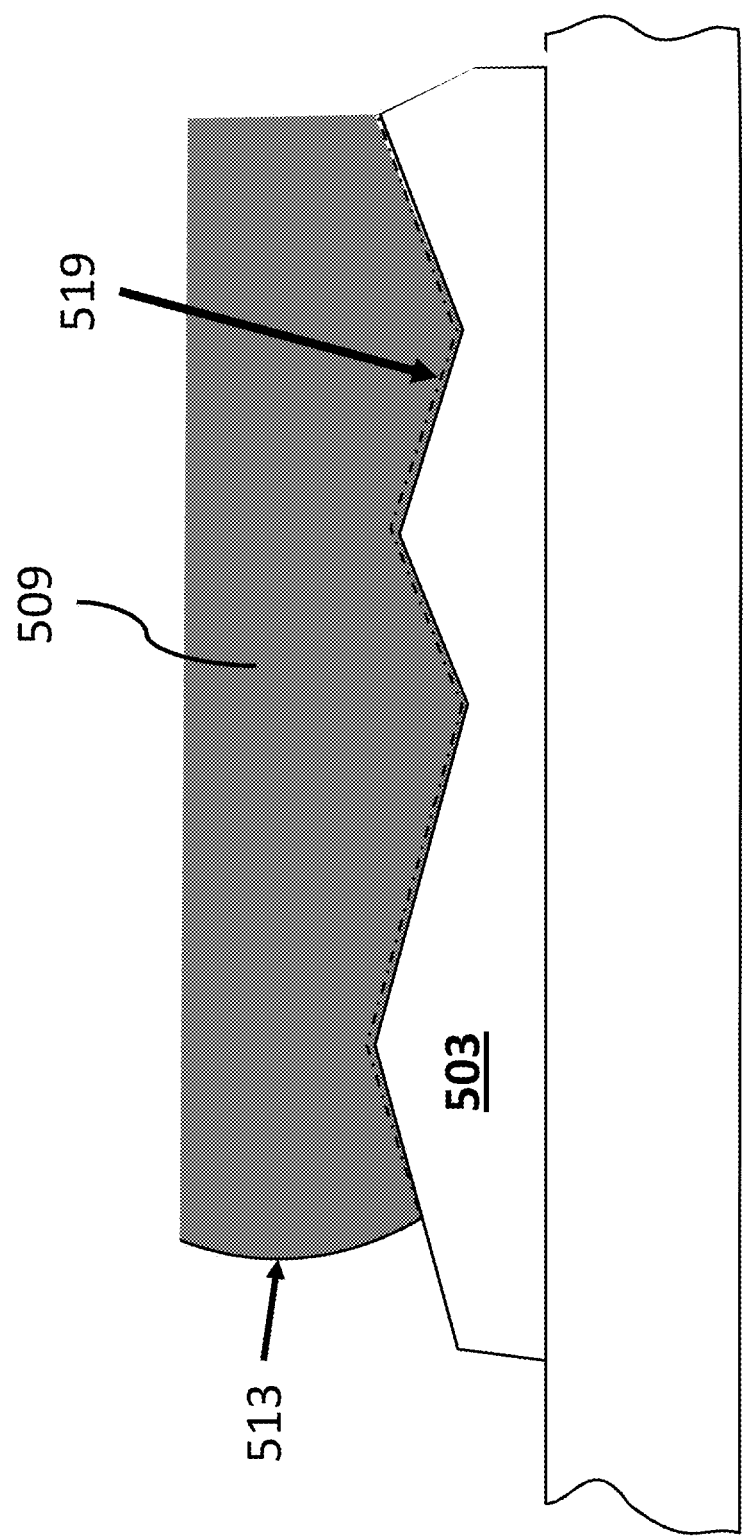
FIGS. 5A-5B show close views of two different bonding interfaces.
Figure 5B:
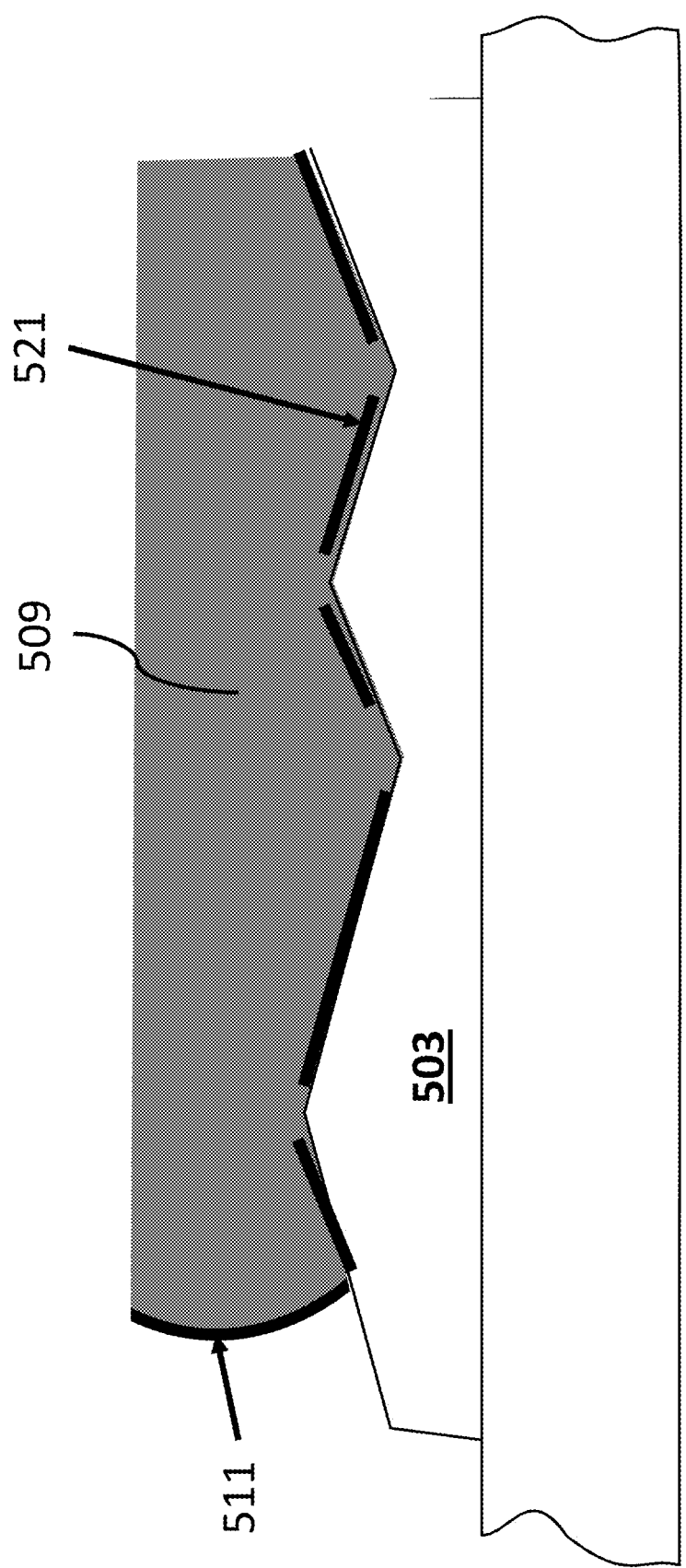

FIGS. 5A and 5B illustrate the effect that the passivation layer can have on metal-metal contact. FIG. 5A shows a zoomed-in view of an interface between a bump 509 and a contact pad 503 which have been bonded using the methods of the present application. Bump 509 has been treated to remove native oxides and to form a passivation layer 513. At the interface between bump 509 and contact pad 503, passivation layer 513 has disintegrated into atomic interstitials 519, which have essentially no effect on metal-metal bonds.

In contrast to FIG. 5A, FIG. 5B shows an equivalent interface in which bump 509 has not been passivated, and thus retains native oxide layer 511, which can be e.g. 50 monolayers thick. At the interface between bump 509 and contact pad 503, oxide layer 511 has, in places, fractured, forming oxide "plates" 521. While some small amount of metal-metal bonding can occur at the breaks in the oxide plates 521, this minimal contact does essentially nothing to prevent the separation of bump 509 from contact pad 503, as illustrated by e.g. FIG. 3C.

Figure 6:
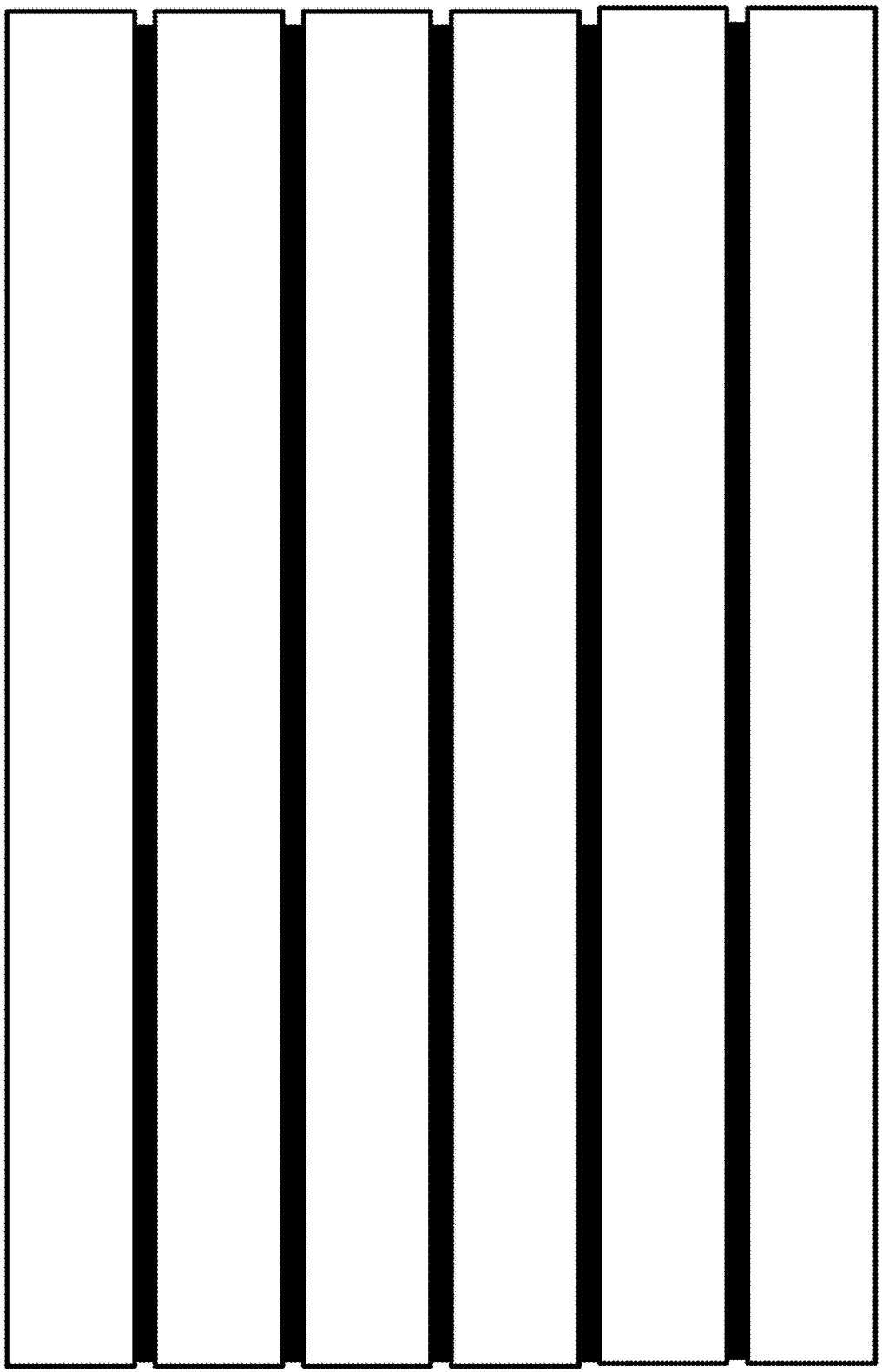
FIG. 6 shows one sample embodiment of a stack assembled by the present innovative methods.

The use of specialized bonding parameters in the present application permits essentially unlimited vertical stacks of chips (or other microelectronic elements), as seen in e.g. FIG. 6, and unlimited horizontal arrays of chip stacks on a given substrate, without the need for solder reflow and all the attendant drawbacks thereof. These specialized chip-to-substrate and chip-to-chip bonding parameters include (i) temperature control, (ii) alignment control of the components to be bonded in X,Y, rotation and parallelism, and (iii) controlled force/time bonding profile of each component to the next, such that melting of the solder never has to take place, and yet strong, stable, conductive connections are permanently made.

Temperature control is important, because it, along with hybrid force, will determine the extent of solid-state deformation of the bump into the contact, which, in turn, determines the security of the bump-to-pad bond. Note that, in some sample embodiments, temperature control can mean room temperature. In some sample embodiments, the bonding temperature can preferably be held in the range of e.g. 10-30° C.

Each candidate bump metal/alloy has its own unique sub-melt-temperature deformation characteristic as a function of force and temperature. The selection of the bump and pad metals will depend largely on the requirements of the final assembly.

If the components are fragile or cannot withstand any heating in the bonding process, a bump of indium against a pad of nickel can be advantageous. This bond can be made at room temperature and modest force, without disturbing the sensitive mechanical or thermal nature of the chips. Indium metal in the room temperature range of 10-30° C. has ideal compression properties, and deforms readily to the microstructure of an opposing nickel contact with minimal force (on the order of 0.1-3 grains per bump, depending on bump size).

In some applications, this can be satisfactory, even though the indium/nickel bond is only stable up to the melting temperature of indium at 156° C. For higher-temperature durability of the bond, a tin-silver alloy bump against a copper contact is a more rigid bond which can survive temperatures up to 240° C., but must be bonded with more force and temperature in order to achieve sufficient solid-state deformation of the tin-silver bump into the copper pad.

This SnAg-to-Cu bond, when performed in the range of e.g. 170 C-190° C., can have the deformability needed to conform to the microstructure of the opposing metal pad with reasonable force (on the order of 0.5-10 grains per bump, depending on bump size).

Alignment control can consist of X-Y alignment, parallelism, and final gap between the chips being bonded. Precise control of these parameters is critical in order to achieve a uniform amount of deformation across all of the bumps on the chips to be bonded, thereby creating a uniform strength of bond across the chip.

For example, there have been 3D designs discussed in the literature which have 5 micron diameter bumps on 8 micron centers. An X-Y misalignment of only 3 microns can cause bridging and a failed assembly.

Likewise, typical Z-compression on such small interconnects can be as little as 3 microns. A variation of only 1 micron in parallelism across a given chip pair will amount to a 33% variation in compression across the area of the chips. These very tight tolerances require special considerations during the alignment and bonding process, since they can easily be overwhelmed by mechanical tolerances in the bonding equipment.

One of these mechanical tolerance issues is alignment shift and drift induced in the bonding equipment by the bonding temperature itself. The lower the bonding temperature, and the less thermal excursion required during the bond, the better the alignment tolerances can be held by the bonder. This is a major benefit of the present inventions.

The force/time bonding profile is also critical to the success of small-tolerance stacked bonds. When force is ramped too quickly, linear plastic flow regimes are exceeded in the bump metal. This can result in "slip" of alignment and excessive concentration of transient forces into the underlying semiconductor materials. This can, in turn, result in lattice defects and even cracking, which will reduce product yield.

Since several layers of chips will be stacked upon each other sequentially, care must be taken to not exceed the "per bump" forces used in previous bonds. If this force is exceeded, it can cause those previous bonds to over-compress or shift.

The ideal amount of compression force will be just enough to achieve an unvoided "footprint" of the bump on the pad. Too little compression, and there can be voids that reduce the effective contact area and thus the strength of the bond. Too much compression, and the bump can be over-squeezed to the point of intra-bump shorting, or excessive stress to the underlying or overlying chip.

The diameter and shape of the bump can be adjusted to reduce the amount of force required to achieve an unvoided footprint: smaller bump diameter, or higher aspect ratio of height to diameter, can decrease the amount of force required to compress the deformable bump.

Within the mechanical and thermal restrictions of the chips being assembled, appropriate combinations of bump and landing pad metals can be chosen. The general choices of deformable bump materials can include, but are not limited to, indium, silver, gold, tin, lead, gallium, bismuth, antimony, aluminum, and alloys of these elements which are of low enough Young's modulus to be sufficiently deformable at temperatures between room temperature and the metal's melting point.

The lower the Young's modulus of a given bump metal, the more suited that bump metal can be for mechanically sensitive die such as compound semiconductors. In one sample embodiment, indium bumps can be used for an HgCdTe detector chip in order to avoid stress/strain issues in that sensitive II-VI material system.

Metals having lower Young's modulus tend to have lower melting points. Pure indium can be unsuitable for bonding applications where the assembly is subsequently subjected to temperatures in excess of 156° C. (melting point of indium). An alloy of indium with silver will have a higher melting temperature than will pure indium.

For example, a 10% addition of silver to indium will increase the melting temperature to 237° C. Along with that increase in silver content comes an increase in Young's modulus. This, in turn, increases the amount of force per unit area required to deform the bump into the microstructure of the opposing metal landing pad. This provides an example of the kind of trade-off which must be made in the choice of bump metal.

Likewise, the opposing landing pad to which the bump is to be bonded can be carefully chosen to fit the restrictions of the chip upon which it is patterned and the metallurgy of the opposing bump. In the case of an indium bump, nickel can be an appropriate choice of contact metal. Nickel generally has a larger grain structure into which to deform the indium, and is also metallurgically compatible with indium. Thin, stable, robust intermetallics are formed between indium and nickel, which can actually enhance the bonding between the two metals.

Conversely, the choice of gold as a landing pad for indium can be a hazardous one. The fragile nature of certain gold/indium intermetallics can have a deleterious effect on bond reliability.

The landing pad can also consist of a metal which alloys (after the bond) in a complementary manner with the opposing bump. An indium bump can be bonded with a silver landing pad, wherein the indium bump is soft enough to conform intimately to the silver pad. Once intimate contact is formed, the silver and indium will solid-state-alloy with each other to form an intermetallic alloy, which has a much higher melting point than the original indium bump.

This bi-metallic bonding technique is fairly common knowledge in flip-chip bonding technology, but the employment of the present inventions within the enhancements provided by the innovative methods of the present inventions enables a higher-quality bond at sub-reflow temperatures.

Reduction and passivation steps have a surprising effect on gold-gold bonds. While it is generally widely believed that gold does not oxidize, the present inventor has discovered that this is not the case. Gold generally forms a layer of oxide 1-1.5 monolayers thick. This native oxide layer inhibits gold-gold bonding to a startling, and previously unknown, degree. Using the innovative methods of the present application, gold-gold bonds can be formed at temperatures of 100° C. with relatively little force. If the reduction and/or passivation steps taught by the present application are omitted from the process, gold-gold bonds must be formed at temperatures above 350° C. with twice the compression force.

In one experiment, the surface preparation steps of the present application were omitted, and gold pads were bonded to gold pads at a temperature of 200° C. This yielded very poor adhesion between gold pads, even though significant visual pad-to-pad compression was present. By contrast, sister dice treated with the surface preparation processes of the present application and bonded under identical conditions yielded remarkable gold-to-gold adhesion. Pull-apart tests showed metallurgical tensile rupture within the gold bulk, and adhesion was so good that many gold bond pads were ripped away from the substrate, taking chunks of underlying silicon with them.

The teachings of the present application are in contrast to traditional assembly techniques, where each successive layer is reflow-bonded to the top of the stack. Such repeated iterations of thermal cycling up to the melting point of the solder can be detrimental to previous solder joints, due to re-melting and/or thermal expansion stresses between chips. This can lead to loss of alignment between chips, over-compression of bumps, fatigue stresses in the bumps, contacts, and semiconductor chips, loss of inter-chip parallelism, delamination of contact layers, and/or opening of previously secure connections. Therefore, the present inventions enable low range thermal cycle, and even thermal-cycle-free, precision assembly of multiple layers and/or stacks of chips.

Using conventional solder reflow, the reflowed solder columns are defined by fluid forces, based on the volume of solder relative to adhesion and surface tension of the melted solder. Once the solder is formed and melted, the user has no control over the column formation. The present application can allow the user much greater control over the formation of contacts.

Following are some experimental results. Note that the bonding forces are given in units of grains-force per square micron of compression area ($gf/\mu m^2$), where 1 gf=9.807 mN.

First Example

SnAg bumps (3.5% Ag) are bonded to copper pads (or Cu pillars) at an elevated temperature below the melting point, in a process typical of an elevated temperature (but still below the melting point) bond, as follows. The cell pitch is 20 μm and the bonding force is 0.0068 $gf/\mu m^2$.

1. Substrate 1 is patterned with copper contact pads using e.g. typical industry-standard bump plating techniques.
2. Substrate 2 is patterned on one side with copper posts capped with SnAg. Pre-bond reflow can be performed to round the SnAg cap, if desired, but this is not necessary for the process to work. The back side of the same substrate is patterned with copper pads which can be connected to chip circuitry (with, for example, "through-silicon vias" (TSV)).
3. Substrate 3 is fabricated in a manner similar to Substrate 2 (SnAg/Cu bumps on one side and copper pads on the other side.)
4. Atmospheric plasma treatment removes oxide from the copper pads of substrate 1 and then passivates them against re-oxidation.
5. Atmospheric plasma treatment removes oxide from the SnAg bumps on Substrate 2 and then passivates them against re-oxidation.
6. Substrate 1 and substrate 2 are placed face-to-face (SnAg bump to copper pad) in a flip-chip bonder and aligned. Appropriate force (0.0068 $gf/\mu m^2$) is applied and the assembly is heated to 180° C., and the softened SnAg bumps compress into the copper pads. Instant SnAg-copper adhesion can be achieved.
7. The bonded 1-2 assembly is removed from the flip-chip bonder and is treated with atmospheric plasma on the face-up side of former substrate 2 (copper pads) as in step 4 above.
8. Substrate 3 is treated with atmospheric plasma on the SnAg bump side as in step 5 above.
9. Substrate 1-2 and substrate 3 are placed face-to-face (SnAg bump to copper pad) in a flip-chip bonder and aligned. Appropriate force (0.0068 $gf/\mu m^2$) is applied and the assembly is heated to 180° C., and the softened SnAg bumps compress into the copper pads. Instant SnAg-copper adhesion can be achieved without disturbing the previously-made bond between substrates 1 and 2.
10. This procedure can be repeated for each subsequent chip to be stacked on the 3D structure. Following attachment of the final chip in the stack, the whole assembly can be reflowed, if desired, although reflow is not typically required.

Second Example

The second example is generally similar to the first example above, except that the copper pads are replaced with nickel pads.

Third Example

The third example is generally similar to the first example, except that the SnAg bumps are replaced with SnAgCu (SAC) bumps (SAC 305), the cell pitch is 25 μm, the bonding force is 0.0070 $gf/\mu m^2$, and the bonding is performed at a temperature of 210° C.

Fourth Example

The fourth example is generally similar to the third example, except that the copper pads are replaced with nickel pads.

Fifth Example

The fifth example is generally similar to the first example, except that the SnAg bumps are replaced with bumps of tin, the bonding force is 0.0044 gf/μm², and the cell pitch is 10 μm. A bonding profile for such a bond is shown in FIG. 7.

Sixth Example

The sixth example is generally similar to the fifth example, except that the copper pads are replaced with bumps of tin.

Seventh Example

The seventh example is generally similar to the fifth example, except that the copper pads are replaced with pads of nickel, and the cell pitch is 15 μm.

Eighth Example

The eighth example is generally similar to the first example, except that the bumps of SnAg are replaced with pads of evaporated gold, the copper pads are replaced with pads of evaporated gold, the reduction and passivation steps are simultaneous for each surface, the bonding is performed at a temperature of 100° C., the cell pitch is 15 μm, and the bonding force is 0.0031 gf/μm².

Ninth Example

The ninth example is generally similar to the eighth example, except that the evaporated gold pads are replaced with pads of sputtered gold.

Tenth Example

The tenth example is generally similar to the eighth example, except that the evaporated gold pads are replaced with bumps of electroplated gold, the bonding is performed at a temperature of 125° C., the cell pitch is 40 μm, and the bonding force is 0.0054 gf/μm².

Eleventh Example

The eleventh example is generally similar to the tenth example, except that bumps of electroplated gold are bonded to pads of electroplated gold.

Twelfth Example

The twelfth example is generally similar to the eleventh example, except that the electroplated gold pads are replaced with pads of electroless plated gold, and the bonding is performed at a temperature of 150° C.

Thirteenth Example

The thirteenth example is generally similar to the twelfth example, except that the electroless plated gold pads are replaced with electroless plated gold bumps.

Fourteenth Example

The fourteenth example, bonding InAg bumps (10% Ag) to Ni pads, is typical of a room temperature bond (e.g. one at approximately 20° C.). The cell pitch is 20 μm and the bonding force is 0.0032 gf/μm². The following sequence is performed:
1. Substrate 1 is patterned with nickel contact pads using e.g. typical industry-standard bump plating or vacuum evaporation techniques.
2. Substrate 2 is patterned on one side with InAg (10% Ag) bumps. The back side of the same substrate is patterned with nickel pads which are connected to chip circuitry (with, for example, "through-silicon vias" (TSV)
3. Substrate 3 is fabricated in a manner similar to Substrate 2 (InAg bumps on one side and nickel pads on the other side.)
4. Atmospheric plasma treatment removes oxide from the nickel pads of substrate 1 and then passivates them against re-oxidation.
5. Atmospheric plasma treatment removes oxide from the InAg bumps on substrate 2 and then passivates them against re-oxidation.
6. Substrate 1 and substrate 2 are placed face-to-face (InAg bump to nickel pad) in a flip-chip bonder, aligned, and bonded at room temperature with sufficient force to compress the InAg bumps into the nickel pads. Instant adhesion is achieved.
7. The bonded assembly of substrates 1 and 2 is removed from the flip-chip bonder and is treated with atmospheric plasma on the face-up side of former substrate 2 (nickel pads).
8. Substrate 3 is treated with atmospheric plasma on the InAg bump side.
9. Bonded substrate 1-2 and substrate 3 are placed face-to-face (InAg bump to nickel pad) in a flip-chip bonder, aligned, and bonded at room temperature with sufficient force to compress the InAg bumps of substrate 3 into the nickel pads of substrate 2. Instant adhesion is achieved.
10. This procedure can be repeated for each subsequent chip to be stacked on the 3D structure. No reflow is required.

Fifteenth Example

The fifteenth example is generally similar to the fourteenth example, except that the nickel pads are replaced with bumps of InAg (10% Ag).

Sixteenth Example

The sixteenth example is generally similar to the fourteenth example, except that the bumps of InAg with 10% Ag are replaced with bumps of InAg with 3% Ag, and the bonding force is 0.0021 gf/μm².

Seventeenth Example

The seventeenth example is generally similar to the sixteenth example, except that the nickel pads are replaced with bumps of InAg with 3% Ag.

Eighteenth Example

The eighteenth example is generally similar to the fourteenth example, except that the InAg bumps are replaced with bumps of indium, the reduction and passivation steps are simultaneous for the indium bumps, the cell pitch is 12 μm, and the bonding force is 0.0008 gf/μm².

Nineteenth Example

The nineteenth example is generally similar to the eighteenth example, except that the nickel pads are replaced with pads of gold, the reduction and passivation steps are simultaneous for the gold pads, and the cell pitch is 20 µm.

Twentieth Example

The twentieth example is generally similar to the nineteenth example, except that the bonding is performed at a temperature of 90° C.

Twenty-First Example

The twenty-first example is generally similar to the nineteenth example, except that the gold pads are replaced with indium bumps, and the cell pitch is 5 µm.

Twenty-Second Example

The twenty-second example is generally similar to the twenty-first example, except that the bonding is performed at a temperature of 140° C.

Twenty-Third Example

In the twenty-third example, indium bumps are bonded to silver pads in a bi-metallic alloy room temperature bond, as follows. The cell pitch is 20 µm, and the bonding force is 0.0008 gf/µm$^2$:
1. Substrate 1 is patterned with silver contact pads using typical industry-standard bump plating or vacuum evaporation techniques.
2. Substrate 2 is patterned on one side with indium bumps. The back side of the same substrate is patterned with silver pads which are connected to chip circuitry (with, for example, "through-silicon vias" (TSV).
3. Substrate 3 is fabricated in a manner similar to Substrate 2, with In bumps on one side and Ag pads on the other side.
4. Atmospheric plasma treatment simultaneously removes oxide from the Ag pads of substrate 1 and passivates them against re-oxidation.
5. Atmospheric plasma treatment simultaneously removes oxide from the In bumps on substrate 2 and passivates them against re-oxidation.
6. Substrate 1 and substrate 2 are placed face-to-face, with In bump to Ag pad, in a flipchip bonder, aligned, and bonded at room temperature with sufficient force to compress the In bumps into the Ag pads. Instant adhesion is achieved.
7. The bonded 1-2 assembly is removed from the flipchip bonder and is treated with atmospheric plasma on the face-up side of former substrate 2 (Ag pads).
8. Substrate 3 is treated with atmospheric plasma on the In bump side.
9. Substrate 1-2 and substrate 3 are placed face-to-face (with In bump to Ag pad) in a flipchip bonder, aligned, and bonded at room temperature with sufficient force to compress the In bumps of substrate 3 into the Ag pads of substrate 2. Instant adhesion is achieved.
10. This procedure can be repeated for each subsequent chip to be stacked on the 3D structure.
11. When the last chip in the structure has been bonded in such a fashion, the In—Ag bonds can be left to alloy by room-temperature solid-state diffusion (typically a few hours to a few days). The process can be accelerated by increasing the temperature, for example, 4 hours at 80° C., although many different time-temperature profiles can be used depending upon the extent of alloying required and the thermal stability of the components themselves.

Twenty-Fourth Example

The twenty-fourth example is generally similar to the first example, except that the SnAg bumps are replaced with bumps of copper, the bonding is performed at a temperature of 300° C., the cell pitch is 10 µm, and the bonding force is 0.0172 gf/µm$^2$.

Twenty-Fifth Example

The twenty-fifth example is generally similar to the twenty-fourth example, except that copper bumps are bonded to copper bumps.

Twenty-Sixth Example

The twenty-sixth example is generally similar to the twenty-fourth example, except that copper pads are bonded to copper pads.

Twenty-Seventh Example

The twenty-seventh example is generally similar to the first example, except that the copper pads are replaced with bumps of SnAg (3.5% Ag).

Twenty-Eighth Example

The twenty-eighth example is generally similar to the third example, except that the copper pads are replaced with copper bumps.

Twenty-Ninth Example

The twenty-ninth example is generally similar to the twenty-eighth example, except that the copper bumps are replaced with bumps of SAC 305.

It should be apparent to those skilled in the art that multiple combinations of metals, oxide removal and passivation utilizing atmospheric plasma, and bonding parameters utilizing similar methods (whether heated or room temperature) are possible and should be considered within the scope of these inventions.

According to some but not necessarily all embodiments, there is provided: Methods and systems for low-force, low-temperature thermocompression bonding. The present application teaches new methods and structures for three-dimensional integrated circuits, in which cold thermocompression bonding is used to provide reliable bonding. To achieve this, reduction and passivation steps are preferably both used to reduce native oxide on the contact metals and to prevent reformation of native oxide, preferably using atmospheric plasma treatments. Preferably the physical compression height of the elements is set to be only enough to reliably achieve at least some compression of each bonding element pair, compensating for any lack of flatness. Preferably the thermocompression bonding is performed well below the melting point. This not only avoids the deformation of lower levels which is induced by reflow techniques, but also provides a steep relation of force versus z-axis travel, so that a drastically-increasing resistance to compression helps to regulate the degree of thermocompression.

According to some but not necessarily all embodiments, there is provided: A method for bonding microelectronic elements, comprising the steps of: a) directing plasma-activated radical-enriched gas flow at substantially atmospheric pressure both to first contacting metallizations on a first element and also to second contacting metallizations on a second element, both to reduce native oxides from said contacting metallizations and also to passivate said contacting metallizations against re-oxidation; b) compressing said first and second contacting metallizations together, without any conductive liquid phase material, to thereby bond said second element to said first element; c) repeating said steps a) and b), to thereby bond contacting metallizations on subsequent elements to contacting metallizations on the previous element.

According to some but not necessarily all embodiments, there is provided: A method for bonding microelectronic elements, comprising the steps of: a) using plasma-activated radical-enriched gas flow at substantially atmospheric pressure: to reduce native oxides from the surfaces of first contacting metallizations on a first element; to passivate the surfaces of said first contacting metallizations against re-oxidation; to reduce native oxides from the surfaces of second contacting metallizations on a second element; and to passivate the surfaces of said second contacting metallizations against re-oxidation; b) compressing said first and second contacting metallizations together, without any conductive liquid phase material, to thereby bond said second element to said first element; c) repeating said steps a) and b), to thereby bond contacting metallizations on subsequent elements to contacting metallizations on the previous element; wherein said step of compressing said first and second contacting metallizations together joins one of said contacting metallizations which is of a first type together with another of said contacting metallizations which is of a second type.

According to some but not necessarily all embodiments, there is provided: A method for bonding microelectronic elements, comprising: forming a plurality of elements respectively having contacting metallizations both on a first side and also on a second side; forming at least one one-sided element having contacting metallizations on only one side; a) treating both first contacting metallizations on a first element and second contacting metallizations on a second element with plasma-activated radical-enriched gas flow at substantially atmospheric pressure; wherein said treating step reduces native oxides both from said first and second contacting metallizations, and also inhibits oxide re-formation thereupon; b) aligning and contacting said first and second contacting metallizations, without any conductive liquid phase material, to thereby bond said first and second elements; and c) repeating said steps a) and b), to thereby bond the contacting metallizations on subsequent elements to the contacting metallizations on the previous element; wherein said step of contacting said first and second contacting metallizations together joins one of said contacting metallizations which is of a first type together with another of said contacting metallizations which is of a second type; and repeating said steps a) and b), to thereby bond the contacting metallizations on an element to the contacting metallizations on a one-sided element.

According to some but not necessarily all embodiments, there is provided: A method of bonding microelectronic elements, comprising: a) using plasma-activated radical-enriched gas flow at substantially atmospheric pressure: to reduce native oxides from contacting metallization pads on one side of a first element; and to passivate said contacting metallization pads against re-oxidation; b) using plasma-activated radical-enriched gas flow at substantially atmospheric pressure: to reduce native oxides from deformable contacting metallization bumps on one side of a second element; and to passivate said deformable contacting metallization bumps against re-oxidation; c) compressing said deformable contacting metallization bumps and said contacting metallization pads together, without any conductive liquid phase material; wherein said compressing step compresses said deformable contacting metallization bumps to a final height which is greater than 60% of the initial height of said deformable contacting metallization bumps; d) repeating said steps a), b), and c), to thereby bond the deformable contacting metallization bumps on subsequent elements to the contacting metallization pads on the previous element.

According to some but not necessarily all embodiments, there is provided: A method of bonding microelectronic elements, comprising: a) using plasma-activated radical-enriched gas flow at substantially atmospheric pressure: to reduce native oxides from first contacting metallization pads on a first element; and to passivate said first contacting metallization pads against re-oxidation; b) using plasma-activated radical-enriched gas flow at substantially atmospheric pressure: to reduce native oxides from deformable contacting metallization bumps on one side of a second element; to passivate said deformable contacting metallization bumps against re-oxidation; to reduce native oxides from second contacting metallization pads on the other side of said second element; and to passivate said second contacting metallization pads against re-oxidation; c) compressing said deformable contacting metallization bumps and said first contacting metallization pads together, without any conductive liquid phase material; d) repeating said steps b) and c), to thereby bond the deformable contacting metallization bumps on subsequent elements to the contacting metallization pads on the previous element.

According to some but not necessarily all embodiments, there is provided: A method for bonding microelectronic elements, comprising the steps of: a) directing plasma-activated radical-enriched gas flow at substantially atmospheric pressure both to first contacting metallizations on a first element and also to second contacting metallizations on a second element, both to reduce native oxides from said contacting metallizations and also to passivate said contacting metallizations against re-oxidation; b) compressing said first and second contacting metallizations together, without any conductive liquid phase material, to thereby bond said second element to said first element; c) repeating said steps a) and b), to thereby bond contacting metallizations on subsequent elements to contacting metallizations on the previous element; wherein said plasma-activated radical-enriched gas flow includes a population of helium metastable states.

According to some but not necessarily all embodiments, there is provided: A method for bonding microelectronic elements, comprising the steps of: a) directing plasma-activated radical-enriched gas flow to first contacting metallizations on a first side of a first element, to thereby reduce native oxides from said first contacting metallizations and simultaneously inhibit oxide re-formation thereupon; b) directing plasma-activated radical-enriched gas flow to second contacting metallizations on a first side of a second element, to thereby reduce native oxides from said second contacting metallizations and simultaneously inhibit oxide re-formation thereupon; c) compressing said first and second contacting metallizations together, without any conductive liquid phase material, to thereby bond said second element to said first element; d) repeating said steps a), b), and c), thereby bonding the contacting metallizations on subsequent elements to the contacting metallizations on the previous element; wherein said step of compressing said first and second contacting metallizations together joins one of said contacting metallizations which is of a first type together with another of said contacting metallizations which is of a second type.

According to some but not necessarily all embodiments, there is provided: A method for bonding microelectronic elements, comprising the steps of: a) directing plasma-activated radical-enriched gas flow at substantially atmospheric pressure both to first contacting metallizations on a first element and also simultaneously to second contacting metallizations on a second element, both to reduce native oxides from said contacting metallizations and also to passivate said contacting metallizations against re-oxidation; b) compressing said first and second contacting metallizations together, without any conductive liquid phase material, to thereby bond said second element to said first element; c) repeating said steps a) and b), to thereby bond contacting metallizations on subsequent elements to contacting metallizations on the previous element; wherein the metallic compositions of said first and second contacting metallizations are essentially identical.

According to some but not necessarily all embodiments, there is provided: A method for bonding microelectronic elements, comprising the steps of: a) using plasma-activated radical-enriched gas flow at substantially atmospheric pressure: to reduce native oxides from the surfaces of contacting metallizations on a first element; and to passivate the surfaces of said contacting metallizations against re-oxidation; b) using plasma-activated radical-enriched gas flow at substantially atmospheric pressure: to reduce native oxides from the surfaces of indium-based bumps on a second element; and to passivate the surfaces of said indium-based bumps against re-oxidation; c) compressing said indium-based bumps and said contacting metallizations together, without any conductive liquid phase material, to thereby bond said second element to said first element; d) repeating said steps a), b), and c), to thereby bond the indium-based bumps on subsequent elements to the contacting metallizations on the previous element; wherein said indium-based bumps are comprised of at least 80% atomic indium.

According to some but not necessarily all embodiments, there is provided: A method of bonding microelectronic elements, comprising the steps of: a) using plasma-activated radical-enriched gas flow at substantially atmospheric pressure: to reduce native oxides from contact metallizations on a first element; and to passivate said contact metallizations against re-oxidation; b) using plasma-activated radical-enriched gas flow at substantially atmospheric pressure: to reduce native oxides from tin-based bumps on a second element; and to passivate said tin-based bumps against re-oxidation; c) compressing said tin-based bumps and said contact metallizations together, without any conductive liquid phase material, to thereby bond said second element to said first element; d) repeating said steps a), b), and c), to thereby bond the tin-based bumps on subsequent elements to the contact metallizations on the previous element; wherein said tin-based bumps are comprised of at least 90% atomic tin.

According to some but not necessarily all embodiments, there is provided: A method for bonding microelectronic elements, comprising the steps of: a) using plasma-activated radical-enriched gas flow at substantially atmospheric pressure: to reduce native oxides from the surfaces of first copper-based contacting metallizations on a first side of a first element; and to passivate the surfaces of said first copper-based contact metallizations against re-oxidation; b) using plasma-activated radical-enriched gas flow at substantially atmospheric pressure: to reduce native oxides from the surfaces of second copper-based contacting metallizations on a second element; and to passivate the surfaces of said second copper-based contacting metallizations against re-oxidation; c) compressing said first and second copper-based contacting metallizations together, without any conductive liquid phase material, to thereby bond said second element to said first element; d) repeating said steps a), b), and c), to thereby bond copper-based contacting metallizations on subsequent elements to copper-based contacting metallizations on the previous element.

According to some but not necessarily all embodiments, there is provided: A method for bonding microelectronic elements, comprising the steps of: a) using plasma-activated radical-enriched gas flow at substantially atmospheric pressure: to reduce native oxides from first gold contacting metallizations on a first element; and to passivate said first gold contacting metallizations against re-oxidation; b) using plasma-activated radical-enriched gas flow at substantially atmospheric pressure: to reduce native oxides from second gold contacting metallizations on a first side of a second element; and to passivate said second gold contacting metallizations against re-oxidation; c) compressing said first and second gold contacting metallizations together, without any conductive liquid phase material, to thereby bond said second element to said first element; d) repeating said steps a), b), and c), to thereby bond gold contacting metallizations on subsequent elements to gold contacting metallizations on the previous element.

According to some but not necessarily all embodiments, there is provided: A system for bonding microelectronic elements, comprising: a bonding platform for flip-chip bonding, configured to bond elements by compressing them together, without any conductive liquid phase material, thereby deforming contacting metallizations by no more than 40% of their initial height; an atmospheric plasma applicator, integrated into said bonding platform, which is configured to apply reducing and passivating agents to said contacting metallizations on each said element, by use of plasma-activated radical-enriched gas flow at substantially atmospheric pressure; wherein said reducing and passivating agents reduce native oxides from said contacting metallizations and passivate said contacting metallizations against re-oxidation prior to bonding said element; wherein elements are loaded into said bonding platform and aligned for bonding, said atmospheric plasma applicator applies reducing and passivation agents to the contacting metallizations on said elements, and then the elements are bonded.

Modifications and Variations

As will be recognized by those skilled in the art, the innovative concepts described in the present application can be modified and varied over a tremendous range of applications, and accordingly the scope of patented subject matter is not limited by any of the specific exemplary teachings given. It is intended to embrace all such alternatives, modifications and variations that fall within the spirit and broad scope of the appended claims.

Multiple combinations of metals, oxide removal and passivation utilizing atmospheric plasma, and bonding parameters utilizing similar methods (whether heated or room temperature) are possible and should be considered within the scope of these inventions.

The chip elements being 3D bonded by the methods of the present application can be, but are not limited to, one or more of e.g. logic chips, high-voltage chips, light-emitting elements, photovoltaic elements, MEMs elements, a passive network, a redundant element, a power switch, and an analog interface. These can all have differing preferred supply voltages and substrates, and so each can have different advantages.

In the presently-preferred embodiment, the rain faces of the flip-chip bonder are optically-polished silicon carbide with vacuum grooves for holding chips. However, in alternative embodiments, it is contemplated that this can be different.

In the presently-preferred embodiment, an extremely rigid mechanical structure is below the stack of chips being bonded, in which the parallelism is adjusted by spherical air-bearing release, move, lock-down. However, in alternative embodiments, it is contemplated that this can be different.

In the presently-preferred embodiments, the flip-chip bonder used is a SUSS FC150 Automated Flip Chip Bonder, which is presently commercially available from SET, but in some alternative embodiments, it is envisioned that the specifics of the presently-preferred flip-chip bonder can be changed.

In the presently-preferred embodiment, a moving plasma generation head has been used with controllable gas flows at atmospheric pressure. Thus, the activated gas flow at the surface of the element being prepared is a plasma afterglow, approximately 1 mm downstream from the glow discharge itself. However, in alternative embodiments, it is contemplated that the resultant time delay from the edge of the glow discharge to the active surface can be more or less than this.

In some embodiments, the contact can be e.g. a contact pad, or can be e.g. a contact bump or a contact pillar.

In some embodiments, bump metals can be alloyed with appropriate metals to depress melting points, and thus depress hardness.

In some alternative embodiments, oxide removal and prevention of regrowth can be accomplished by providing a controlled environment around the chips before and during bonding in order to reduce the oxide by chemical vapor or gas, and then inhibit the re-introduction of oxygen to the surfaces during the bonding process.

In some alternative embodiments, the stated metallic compositions can instead be similar or analogous alloys.

In some alternative embodiments, the copper pads can instead be e.g. aluminum.

While bond footprints are most preferably completely unvoided footprints, it will of course be understood that some imperfections can still occur, and that these should still be considered within the scope of the present inventions.

In some sample embodiments, the atmospheric plasma applicator can be e.g. a moving plasma applicator head operating under substantially ambient atmospheric conditions.

In some sample embodiments, reducing and passivating agents can be applied simultaneously by an atmospheric plasma applicator, or they can alternatively be applied sequentially.

In some sample embodiments, the atmospheric plasma head can be compact enough that it can be integrated directly into the flip-chip bonder. While not required for the process to work, this can enable more rapid pick-and-place-like operation with brief insertion of atmospheric surface treatment of the bonding surfaces immediately before each bond.

The final height of the bumps is preferably greater than e.g. 60% of their initial height, and is more preferably greater than e.g. 70% their initial height.

Note that bump size is not limited on the small end of the scale (e.g. 5-10 µm in diameter). This is because the bumps are not melted during compression and therefore do not exhibit the typical oversqueeze tendencies seen with melted solder bonding.

Processes in which the bumps are Sn or SnAg or SnAgCu or similar or analogous alloys most preferably occur at bonding temperatures of e.g. 175° C., but can less preferably occur at bonding temperatures in the range of e.g. 170-225° C.

Processes using bumps of In or InAg or similar or analogous alloys are most preferably performed at room temperature (e.g. controlled temperatures of 20-25° C.), but can less preferably be performed at controlled temperatures of 10-30° C., and even less preferably in the range of 10-150° C.

Bumps of InAg alloy are preferably e.g. 0-10% Ag, and even more preferably e.g. 5% Ag. The added silver content can be increased to increase the melting temperature, but this must be balanced with the resultant increase in hardness.

In some alternative embodiments, de-oxidation of copper can be performed in a reduction-only atmosphere (e.g. H and He only).

In some embodiments, reduction and passivation treatments can be simultaneous or can be sequential (e.g. reduction followed by passivation).

In one sample embodiment, tin bumps can be bonded to copper contacts.

In some alternative embodiments using copper bumps, it is envisioned that the copper can be alloyed with another metal to depress the melting point of the copper bumps, and thus increase its compressibility at lower temperatures.

In some sample embodiments, bumps of Sn, SnAg, SnAgCu, or other leadless solders can be bonded to copper, gold, or an identical or different leadless solder.

In some sample embodiments, indium bumps can be bonded to indium contact bumps.

In some alternative embodiments, gold bumps can be topologically similar to pads, depending on the method of deposition.

In some alternative embodiments, gold pads can have a thickness which is e.g. 10% of their width.

Depending on the metallic compositions of the bumps and the contacts, different atmospheric plasma compositions can be appropriate for treatments of the bumps and the contacts.

Atmospheric plasma treatment of the two chip elements being bonded can be at different times, or can alternatively be simultaneous if the bumps and contact pads have essentially the same metallic composition, in which case the atmospheric plasma treatment most preferably uses a scanning plasma head. The atmospheric plasma treatment being simultaneously applied can be simultaneous reduction and passivation, or can alternatively be reduction followed by passivation.

In some alternative embodiments, the bumps and contacts can be e.g. bumps, pads, or pillars, identically or in any operable combination.

In some alternative embodiments, the metals or metal alloys can be replaced with similar or analogous alloys.

In the presently-preferred embodiments, the total bonding force applied to a pair of chips can be e.g. on the order of 1-50 kgf, depending on e.g. bump size and material systems, but in alternative embodiments, it is envisioned that different total bonding forces can be applied as appropriate.

While the final compressed height of bumps is most preferably approximately 75% of initial height, in some alternative embodiments, final bump height can be as low as e.g. 20% of initial bump height. This can be preferable for embodiments having coarser cell pitches.

A practitioner skilled in the science of metallurgy and contact deposition will have a broad range of choices depending upon the metallurgical, thermal and mechanical boundary conditions of the particular application.

None of the description in the present application should be read as implying that any particular element, step, or function is an essential element which must be included in the claim scope: THE SCOPE OF PATENTED SUBJECT MATTER IS DEFINED ONLY BY THE ALLOWED CLAIMS. Moreover, none of these claims are intended to invoke paragraph six of 35 USC section 112 unless the exact words "means for" are followed by a participle.

The claims as filed are intended to be as comprehensive as possible, and NO subject matter is intentionally relinquished, dedicated, or abandoned.

What is claimed is:

1. A method for bonding microelectronic elements, comprising the steps of:
    a) directing plasma-activated radical-enriched gas flow at substantially ambient atmospheric conditions to first contacting metallizations on a first element, both to reduce native oxides from said contacting metallizations and also to passivate said contacting metallizations against re-oxidation;
    b) directing plasma-activated radical-enriched gas flow at substantially ambient atmospheric conditions to second contacting metallizations on a second element, both to reduce native oxides from said contacting metallizations and also to passivate said contacting metallizations against re-oxidation;
    c) compressing said first and second contacting metallizations together, without any conductive liquid phase material, to thereby bond said second element to said first element;
    d) repeating said step c), using additional elements which have been subjected to step a) to bond contacting metallizations on each of the additional elements to contacting metallizations on an unbonded side of a previously bonded element;
    wherein said first contacting metallizations are made essentially of nickel; and
    wherein said compressing step compresses said contacting metallizations by no more than 40% of the initial heights of said contacting metallizations.

2. A method for bonding microelectronic elements, comprising the steps of:
    a) using plasma-activated radical-enriched gas flow at substantially ambient atmospheric conditions: to reduce native oxides from surfaces of first contacting metallizations on a first element; to passivate the surfaces of said first contacting metallizations against re-oxidation;
    b) using plasma-activated radical-enriched gas flow at substantially ambient atmospheric conditions: to reduce native oxides from surfaces of second contacting metallizations on a second element; and to passivate the surfaces of said second contacting metallizations against re-oxidation;
    c) compressing said first and second contacting metallizations together, without any conductive liquid phase material, to thereby bond said second element to said first element;
    d) repeating said step c), using additional elements which have been subjected to step a) to y bond contacting metallizations on each of the additional elements to contacting metallizations on an unbonded side of a previously bonded element;
    wherein said step of compressing said first and second contacting metallizations together joins one of said contacting metallizations which is of a first type together with another of said contacting metallizations which is of a second type;
    wherein contacting metallizations of said first type are made essentially of nickel; and
    wherein said compressing step compresses said contacting metallizations by no more than 40% of the initial heights of said contacting metallizations.

3. A method for bonding microelectronic elements, comprising:
    forming a plurality of elements respectively having contacting metallizations both on a first side and also on a second side;
    forming at least one one-sided element having contacting metallizations on only one side;
    a) treating first contacting metallizations on a first element with plasma-activated radical-enriched gas flow at substantially ambient atmospheric conditions;
    wherein said treating step reduces native oxides from said first contacting metallizations, and also inhibits oxide re-formation thereupon;
    b) treating second contacting metallizations on a second element with plasma-activated radical-enriched gas flow at substantially ambient atmospheric conditions;
    wherein said treating step reduces native oxides from said second contacting metallizations, and also inhibits oxide re-formation thereupon;
    c) aligning and compressing said first and second contacting metallizations, without any conductive liquid phase material, to thereby bond said first and second elements; and
    d) repeating said step c), using additional elements which have been subjected to step a) to bond contacting metallizations on each of the additional elements to contacting metallizations on an unbonded side of a previously bonded element;
    wherein said step of compressing said first and second contacting metallizations together joins one of said contacting metallizations which is of a first type together with another of said contacting metallizations which is of a second type; and
    repeating said step c), to bond contacting metallizations on an element which has been subjected to step a) to contacting metallizations on a one-sided element which has been subjected to step a);
    wherein contacting metallizations of said first type are made essentially of nickel; and
    wherein said compressing step compresses said contacting metallizations by no more than 40% of the initial heights of said contacting metallizations.

* * * * *